(12) United States Patent
Zhang et al.

(10) Patent No.: US 12,298,347 B2
(45) Date of Patent: May 13, 2025

(54) DEVICE AND METHOD FOR INSPECTING RELAY, AND CHARGING PILE

(71) Applicant: Sungrow Power Supply Co., Ltd., Hefei (CN)

(72) Inventors: Lei Zhang, Hefei (CN); Xin Chen, Hefei (CN); Zengfu Ding, Hefei (CN); Yuefeng Yang, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 164 days.

(21) Appl. No.: 17/684,463

(22) Filed: Mar. 2, 2022

(65) Prior Publication Data
US 2022/0283224 A1  Sep. 8, 2022

(30) Foreign Application Priority Data
Mar. 5, 2021  (CN) .......................... 202110246136.0

(51) Int. Cl.
*G01R 31/327*  (2006.01)

(52) U.S. Cl.
CPC ................. *G01R 31/3278* (2013.01)

(58) Field of Classification Search
CPC .................................................. G01R 31/3278
See application file for complete search history.

(56) References Cited

U.S. PATENT DOCUMENTS

| | | | | |
|---|---|---|---|---|
| 6,498,451 B1 * | 12/2002 | Boules | ................. | B62D 5/0403 |
| | | | | 318/400.06 |
| 9,069,044 B2 * | 6/2015 | Tae | ...................... | G01R 31/006 |
| 2018/0113170 A1 * | 4/2018 | Liu | ....................... | G01R 31/327 |
| 2019/0096611 A1 * | 3/2019 | Papenbreer | .............. | H01H 9/54 |
| 2020/0244060 A1 * | 7/2020 | Henke | .................... | H03K 3/313 |

FOREIGN PATENT DOCUMENTS

| | | | | |
|---|---|---|---|---|
| CN | 106740200 | * | 2/2017 | ............. B60L 11/18 |
| CN | 106740200 A | | 5/2017 | |
| CN | 110103754 | * | 8/2019 | ............. B60L 53/31 |
| CN | 110901449 | * | 3/2020 | ............. B60L 53/31 |
| CN | 110901449 A | | 3/2020 | |

OTHER PUBLICATIONS

Extended European Search Report for European Application No. 22159648.9, dated Aug. 19, 2022.

* cited by examiner

*Primary Examiner* — Alexander Satanovsky
*Assistant Examiner* — Sharah Zaab
(74) *Attorney, Agent, or Firm* — Wolf, Greenfield & Sacks, P.C.

(57) ABSTRACT

A detection device, and a method for inspecting a relay, and a charging pile are provided. The detection device includes a detection module and an isolation output module. The detection module includes a first signal input terminal for connecting to an output side of a relay and a second signal input terminal for connecting to a neutral wire. A signal output terminal of the detection module is configured to connect to a control end of the isolation output module. The detection module is configured to output a control signal based on an on-off state of the relay. A signal output terminal of the isolation output module is configured to connect to a fault identification device. The isolation output module is configured to output a to detection signal with a duty cycle corresponding to the control signal, to inform the fault identification device to detect whether the relay is stuck.

19 Claims, 18 Drawing Sheets

DEVICE AND METHOD FOR INSPECTING RELAY, AND CHARGING PILE

The present disclosure claims priority to Chinese Patent Application No. 202110246136, titled "DEVICE AND METHOD FOR INSPECTING RELAY, AND CHARGING PILE", filed on Mar. 5, 2021 with the China National Intellectual Property Administration, which is incorporated herein by reference in its entirety.

FIELD

Embodiments of the present disclosure relates to charging technologies, and in particular to a detection device for a relay and a method for inspecting a relay, and a charging pile.

BACKGROUND

An alternating current relay in an alternating current charging pile that is charging an electric vehicle may be stuck, resulting in a risk of electric shock or charging being out of control.

According to the conventional technology as shown in FIG. 1, adhesion detection on a relay depends on cooperation between two relays, and one of the two relays is always on, failing to perform adhesion detection on two relays simultaneously. In addition, in a case that one relay is not stuck, the relay not stuck has to be turned on in order to detect whether the other relay is stuck following this software logic, which may result in secondary hazards.

SUMMARY

A device detection for a relay, a method for inspecting a relay, and a charging pile are provided according to the present disclosure, so as to perform adhesion detection on each of all relays in the charging pile without an action of a relay.

A detection device for a relay is provided according to a first aspect of the present disclosure. The detection device includes a detection module and an isolation output module. The detection module includes a first signal input terminal and a second signal input terminal. The number of the first signal input terminal is at least one. The first signal input terminal is configured to connect to an output side of a to-be-detected relay. The second signal input terminal is configured to connect to a neutral wire. A signal output terminal of the detection module is configured to connect to a control end of the isolation output module. The detection module is configured to output a control signal based on an on-off state of the to-be-detected relay. A signal output terminal of the isolation output module is configured to connect to a fault identification device, and the isolation output module is configured to output a detection signal with a duty cycle corresponding to the control signal, to inform the fault identification device to detect whether the to-be-detected relay is stuck.

In an embodiment, the detection module includes a first unidirectional conduction unit and a second unidirectional conduction unit. The number of the first unidirectional conduction unit is at least one. A first terminal of the at least one first unidirectional conduction unit serves as the first signal input terminal, and a second terminal of the at least one first unidirectional conduction unit is connected together, as a signal output terminal of the detection module. A first terminal of the second unidirectional conduction unit serves as another signal output terminal of the detection module. A second terminal of the second unidirectional conduction unit serves as the second signal input terminal. The first terminal of the second unidirectional conduction unit is identical to the first terminal of the first unidirectional conduction unit in polarity.

In an embodiment, the number of the first unidirectional conduction unit is one, and the detection module further includes a third unidirectional conduction unit and a fourth unidirectional conduction unit. An anode of the third unidirectional conduction unit is connected to an anode of the second unidirectional conduction unit, and the common anode of the third unidirectional conduction unit and the second unidirectional conduction unit serves as a signal output terminal of the detection module. A cathode of the fourth unidirectional conduction unit is connected to a cathode of the first unidirectional conduction unit, and the common cathode of the fourth unidirectional conduction unit and the first unidirectional conduction unit serves as another signal output terminal of the detection module. A cathode of the third unidirectional conduction unit serves as a third signal input terminal of the detection module. An anode of the fourth unidirectional conduction unit serves as a fourth signal input terminal of the detection module. The second signal input terminal and the third signal input terminal each serve as a signal input terminal of the detection module configured to connect to an input side of the to-be-detected relay, and the first signal input terminal and the fourth signal input terminal each serve as a signal input terminal of the detection module configured to connect to the output side of the to-be-detected relay.

In an embodiment, the number of the first unidirectional conduction unit is one, and the detection module further includes a third unidirectional conduction unit and a fourth unidirectional conduction unit. A cathode of the third unidirectional conduction unit is connected to a cathode of the second unidirectional conduction unit, and the common cathode of the third unidirectional conduction unit and the second unidirectional conduction unit serves as a signal output terminal of the detection module. The common anode of the fourth unidirectional conduction unit and the first unidirectional conduction unit, and the common anode of the fourth unidirectional conduction unit and the first unidirectional conduction unit serves as another signal output terminal of the detection module. An anode of the third unidirectional conduction unit serves as a third signal input terminal of the detection module. A cathode of the fourth unidirectional conduction unit serves as a fourth signal input terminal of the detection module. The second signal input terminal and the third signal input terminal each serve as a signal input terminal of the detection module configured to connect to an input side of the to-be-detected relay. The first signal input terminal and the fourth signal input terminal each serve as a signal input terminal of the detection module configured to connect to the output side of the to-be-detected relay.

In an embodiment, the number of the first unidirectional conduction unit is three, and the detection module further includes a third unidirectional conduction unit and a fourth unidirectional conduction unit. An anode of the third unidirectional conduction unit is connected to an anode of the second unidirectional conduction unit, and the common anode of the third unidirectional conduction unit and the second unidirectional conduction unit serves as a signal output terminal of the detection module. A cathode of the fourth unidirectional conduction unit is connected to cathodes of the three first unidirectional conduction units, and the common cathode of the fourth unidirectional conduction unit and the three first unidirectional conduction unit serves as another signal output terminal of the detection module. A cathode of the third unidirectional conduction unit serves as a third signal input terminal of the detection module. An anode of the fourth unidirectional conduction unit serves as a fourth signal input terminal of the detection module. The second signal input terminal and the third signal input terminal each serve as a signal input terminal of the detection module configured to connect to an input side of the to-be-detected relay. The first signal input terminal and the fourth signal input terminal each serve as a signal input terminal of the detection module configured to connect to the output side of the to-be-detected relay.

In an embodiment, the number of the first unidirectional conduction unit is three, and the detection module further includes a third unidirectional conduction unit and a fourth unidirectional conduction unit. A cathode of the third unidirectional conduction unit is connected to a cathode of the second unidirectional conduction unit, and the common cathode of the third unidirectional conduction unit and the second unidirectional conduction unit serves as a signal output terminal of the detection module. An anode of the fourth unidirectional conduction unit is connected to an anode of the first unidirectional conduction unit, and the common anode of the fourth unidirectional conduction unit and the first unidirectional conduction unit serves as another signal output terminal of the detection module. An anode of the third unidirectional conduction unit serves as a third signal input terminal of the detection module. A cathode of the fourth unidirectional conduction unit serves as a fourth signal input terminal of the detection module. The second signal input terminal and the third signal input terminal each serve as a signal input terminal of the detection module configured to connect to an input side of the to-be-detected relay. The first signal input terminal and the fourth signal input terminal each serve as a signal input terminal of the detection module configured to connect to the output side of the to-be-detected relay.

In an embodiment, the detection device further includes a controllable switch. The controllable switch is connected between a signal output terminal of the detection module and the control end of the isolation output module, and a control terminal of the controllable switch is configured to connect to the fault identification device. The controllable switch is configured to control, in response to the fault identification device, the detection device to start or stop adhesion detection.

In an embodiment, the isolation output module includes an optocoupler. An anode and a cathode of a light-emitting diode of the optocoupler respectively serve as two terminals at the control end of the isolation output module. A collector of a phototransistor of the optocoupler is configured to connect to a preset voltage, as the signal output terminal of the isolation output module, and an emitter of the phototransistor of the optocoupler is grounded.

A detection device for a relay is further provided according to a second aspect of the present disclosure. The detection device includes a detection module and an isolation output module. The detection module includes two first signal input terminals, one second signal input terminal, one third signal input terminal and one fourth signal input terminal. The two first signal input terminals are configured to respectively connect to output sides of two to-be-detected relays. The third signal input terminal is configured to connect to an input side of one of the two to-be-detected relays. The second signal input terminal and the fourth signal input terminal are configured to respectively connect to an input side and an output side of another to-be-detected relay. A signal output terminal of the detection module is connected to a control end of the isolation output module, and the detection module is configured to output a control signal based on an on-off state of a to-be-detected relay. A signal output terminal of the isolation output module is configured to connect to a fault identification device. The isolation output module is configured to output a detection signal with a duty cycle corresponding to the control signal, to inform the fault identification device to detect whether there is a to-be-detected relay being stuck.

In an embodiment, the detection module includes two first unidirectional conduction units, one second unidirectional conduction unit, one third unidirectional conduction unit and one fourth unidirectional conduction unit. First terminals of the first unidirectional conduction units serve as the two first signal input terminals respectively, second terminals of the two first unidirectional conduction units are connected to a second terminal of the fourth unidirectional conduction unit, as a signal output terminal of the detection module. A first terminal of the second unidirectional conduction unit is connected to a first terminal of the third unidirectional conduction unit, as another signal output terminal of the detection module; and a second terminal of the second unidirectional conduction unit serves as the second signal input terminal, and a second terminal of the third unidirectional conduction unit serves as the third signal input terminal. Respective first terminals of the four unidirectional conduction units are identical in polarity.

A method for inspecting a relay is further provided according to a third aspect of the present disclosure. The method is applied to the detection device for a relay according to the present disclosure. The method includes: outputting, by a detection module, a control signal based on an on-off state of a to-be-detected relay; and outputting, by the isolation output module, a detection signal with a duty cycle corresponding to the control signal, to inform the fault identification device to detect whether the to-be-detected relay is stuck.

A charging pile is further provided according to the present disclosure. The charging pile includes the detection device for a relay according to any one of embodiments of the present disclosure.

The detection device for a relay according to the embodiment includes a detection module. The detection module output a control signal to the isolation output module based on an on-off state of the to-be-detected relay. The isolation output module outputs a detection signal with a duty cycle to a fault identification device based on the control signal, to inform the fault identification device to detect based on the duty cycle of the detection signal whether the to-be-detected relay is stuck. Compared with the conventional technology, the detection device according to the embodiment can perform adhesion detection on a relay without an action of a relay, having a simple circuit structure. In addition, the detection device according to the embodiment can automatically outputs a detection signal with a duty cycle corresponding to a result of the adhesion detection, so that the fault identification device can automatically detect whether the to-be-detected relay is stuck. It is unnecessary to control a relay to be switched off, and therefore secondary hazards are avoided, thereby improving the safety of the alternating current charging pile.

DETAILED DESCRIPTION

Figure 1:
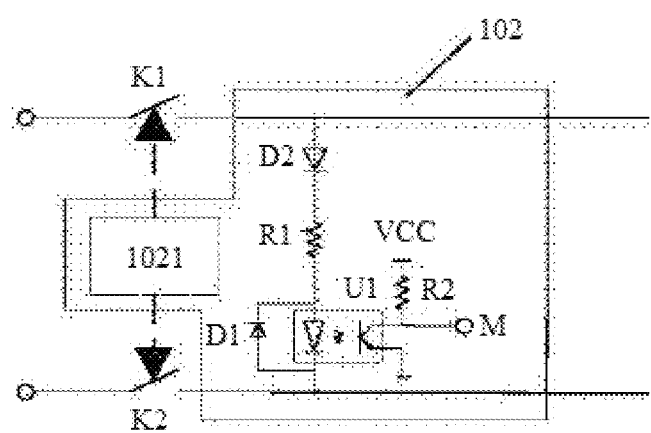
FIG. 1 is a schematic diagram showing a charging device according to the conventional technology.

Hereinafter, the present disclosure is further described in detail in conjunction with the drawings and embodiments. It should be understood that the embodiments described herein are only for explaining the present disclosure, rather than limiting the present disclosure. In addition, it should further be noted that, for ease of description, only some of structures related to the present disclosure, rather than all of the structures, are show in the drawings.

Figure 2:
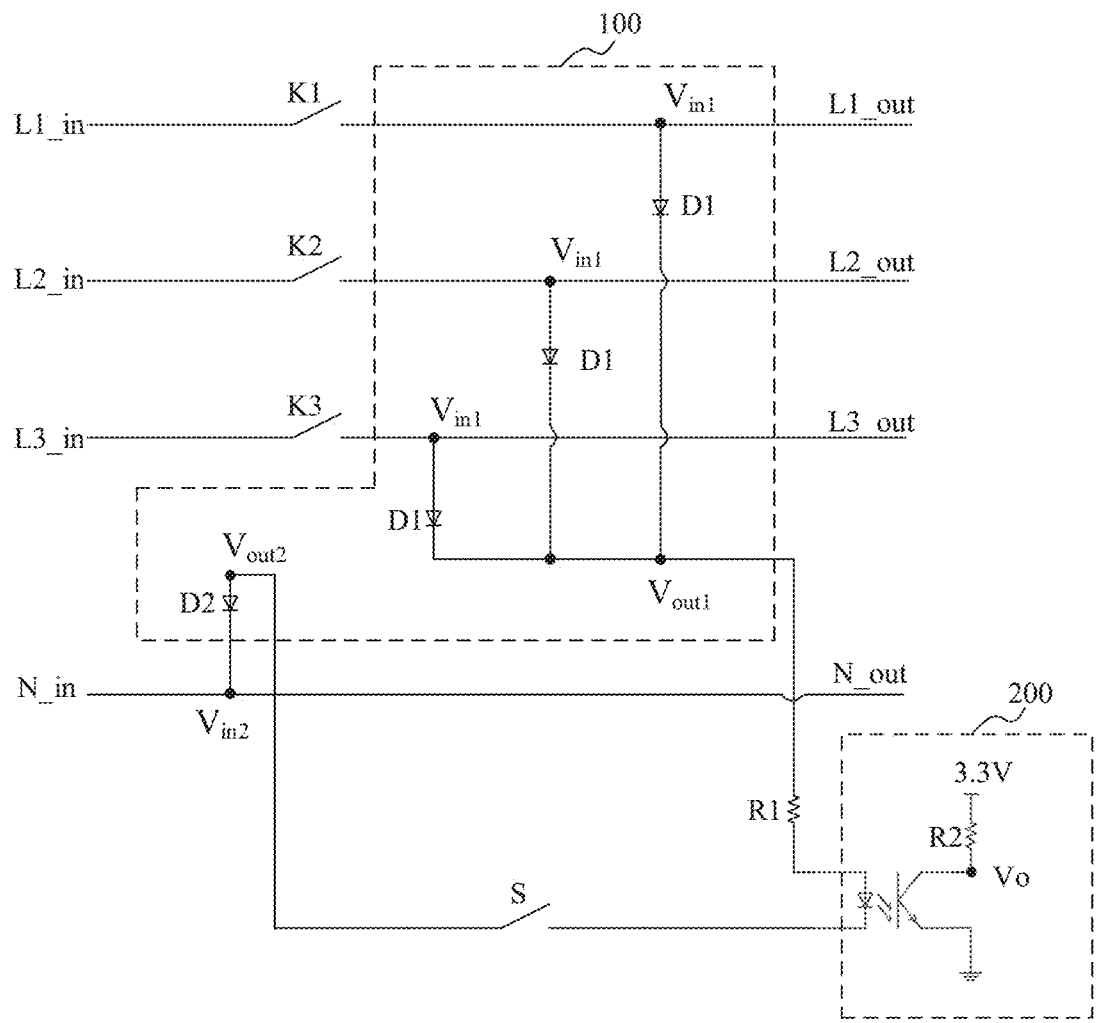
FIG. 2 is a structural block diagram showing a detection device for a relay according to an embodiment of the present disclosure.

FIG. 2 is a structural block diagram showing a detection device for a relay according to an embodiment of the present disclosure. The device may be arranged in a power supply control device of an alternating current charging pile, so as to perform adhesion detection on a relay in a power supply device of the alternating current charging pile. The detection device is especially applicable to an alternating current charging pile including a relay on a live wire only. The alternating current charging pile includes a live wire relay. For example, a three-phase alternating current charging pile may include three live wire relays K1, K2 and K3, and a single-phase alternating current charging pile may include one live wire relay K3. As shown in FIG. 2, the detection device includes a detection module 100 and an isolation output module 200.

The detection module 100 includes a first signal input terminal Vin1 and a second signal input terminal Vin2, and the number of the first signal input terminal Vin1 is at least one. The first signal input terminal Vin1 is configured to connect to an output side of a to-be-detected relay. The second signal input terminal Vin2 is configured to connect to a neutral wire. A signal output terminal of the detection module 100 is connected to a control terminal of the isolation output module 200. The detection module 100 is configured to output a control signal based on an on-off state of the to-be-detected relay.

A signal output terminal of the isolation output module 200 is configured to connect to a fault identification device. The isolation output module 200 is configured to output a detection signal with a duty cycle corresponding to the control signal, to inform the fault identification device to detect whether the to-be-detected relay is stuck.

Figure 3:
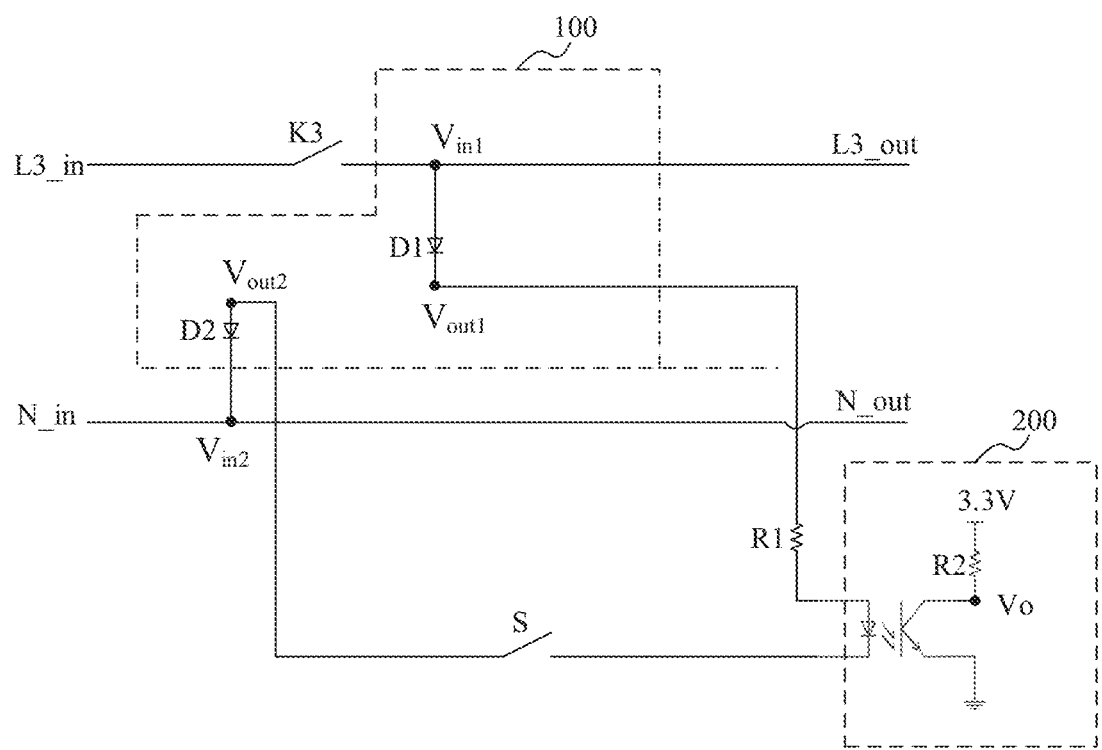
FIG. 3 is a structural block diagram showing a detection device for a relay in a simplified way according to an embodiment of the present disclosure.

The to-be-detected relay in the embodiment is a live wire relay. In a case that the number of the to-be-detected relay is one, the charging pile is a single-phase alternating current charging pile, and only a live wire is provided with a relay. In this case, the detection device is as shown in FIG. 3 in a simplified way. In a case that the number of the to-be-detected relay is three, the charging pile is a three-phase alternating current charging pile, and three live wires each are provided with a relay.

Accordingly, in a case that the number of the first signal input terminal Vin1 is one, the detection device is appliable to the single-phase alternating current charging pile including a live wire relay. In a case that the number of the first signal input terminal Vin1 is three, the detection device is appliable to a three-phase alternating current charging pile including three live wire relays.

The first signal input terminal Vin1 is configured to connect to the output side of the to-be-detected relay. In a case that the to-be-detected relay is stuck, the to-be-detected relay is turned on, and a charging signal is applied to the detection module 100 via the first signal input terminal Vin1 and the second signal input terminal Vin2, so that a rectifying path in the detection module 100 outputs a rectified signal as the control signal for validation to the isolation output module 200. In a case that the to-be-detected relay is not stuck, the to-be-detected relay is turned off, and the charging signal fails to be applied to the detection module 100, so that the detection module 100 outputs no rectified signal, that is, the detection module 100 outputs the control signal for invalidation. Therefore, the detection module 100 outputs the control signal based on the -on-off state of the to-be-detected relay (that is, a fact that the to-be-detected relay is or is not stuck), so as to establish a correspondence between a result of whether the to-be-detected relay is stuck and the control signal outputted by the detection module 100.

The signal output terminal of the detection module 100 is connected to a control end of the isolation output module 200. As described above, the detection module 100 outputs the control signal depending on the on-off state of the to-be-detected relay (that is, a fact that the to-be-detected relay is or is not stuck). In addition, since the alternating current charging signal is periodic, the control signal outputted by the detection module 100 changes periodically. The control signal is applied to the isolation output module 200, so that the isolation output module 200 outputs the detection signal with a duty cycle corresponding to the control signal. In a case that the detection module 100 outputs the control signal for validation and invalidation alternately, the isolation output module 200 outputs the detection signal with a certain duty cycle.

The detection signal may be, for example, at a high or low level. For example, in a case that the detection module 100 outputs the control signal for validation, the isolation output module 200 outputs the detection signal at a low level. In a case that the detection module 100 outputs the control signal for invalidation, the isolation output module 200 outputs the detection signal at a high level. Therefore, in a case that the detection module 100 outputs the control signal for validation and invalidation alternately, the isolation output module 200 outputs the detection signal with the certain duty cycle.

The signal output terminal of the isolation output module 200 is configured to connect to the fault identification device. The isolation output module 200 outputs the detection signal with a duty cycle to the fault identification device, so that the fault identification device detects whether the to-be-detected relay is stuck based on the duty cycle of the detection signal. It can be seen from the above description that the control signal outputted by the detection module 100 in a case that the to-be-detected relay is stuck is different from the control signal outputted by the detection module 100 in a case that the to-be-detected relay is not stuck, so that the isolation output module 200 outputs the detection signal with a duty cycle. That is, the duty cycle of the detection signal outputted by the isolation output module 200 are in a correspondence with the on-off state of the to-be-detected relay. Based on the correspondence, the fault identification device detects whether at least one of the live wire relay and a neutral wire relay is stuck. For example, the correspondence between the duty cycle of the detection signal and the on-off state of the to-be-detected relay is stored in the fault identification device. The fault identification device detects whether the to-be-detected relay is stuck by searching the correspondence based on the duty cycle of the detection signal. It can be seen that in the embodiment, the fault identification device can automatically detect whether a relay is stuck without an action of a relay.

In an embodiment, the fault identification device acts when a relay is detected as being stuck. For example, when detecting that a relay is stuck, the fault identification device outputs a control signal to control the alternating current charging pile to stop outputting the charging signal, so as to stop the charging.

It should be noted that the fault identification device in the embodiment is implemented by a main control unit of the alternating current charging pile, or a main control unit (MCU) arranged outside the alternating current charging pile. In a case that the fault identification device is arranged outside the alternating current charging pile, the fault identification device is in communication connection with the main control unit of the charging pile, to feed back a result of adhesion detection on the relay to the main control unit of the charging pile. The charging pile performs control, for example, stopping charging, based on the result.

The detection device for a relay according to the embodiment includes a detection module. The detection module output a control signal to the isolation output module based on an on-off state of the to-be-detected relay. The isolation output module outputs a detection signal with a duty cycle to a fault identification device based on the control signal, to inform the fault identification device to detect based on the duty cycle of the detection signal whether the to-be-detected relay is stuck. Compared with the conventional technology, the detection device according to the embodiment can perform adhesion detection on a relay without an action of a relay, having a simple circuit structure. In addition, the detection device according to the embodiment can automatically outputs a detection signal with a duty cycle corresponding to a result of the adhesion detection, so that the fault identification device can automatically detect whether the to-be-detected relay is stuck. It is unnecessary to control a relay to be switched off, and therefore secondary hazards are avoided, thereby improving the safety of the alternating current charging pile.

In an embodiment, based on the above embodiment, reference is made to FIGS. 2 and 3. The detection module 100 includes a first unidirectional conduction unit D1 and a second unidirectional conduction unit D2. The number of the first unidirectional conduction unit D1 is at least one.

A first terminal of the first unidirectional conduction unit D1 serves as the first signal input terminal Vin1. A second terminal of all the first unidirectional conduction unit D1 is connected, serving as the signal output terminal Vout1 of the detection module 100.

A first terminal of the second unidirectional conduction unit D2 serves as another signal output terminal Vout2 of the detection module 100. A second terminal of the second unidirectional conduction unit D2 serves as the second signal input terminal Vin2. The first terminal of the second unidirectional conduction unit D2 is the same as the first terminal of the first unidirectional conduction unit D1.

In an embodiment, the unidirectional conduction unit may be, for example, a rectifier diode. In a case that the number of the first unidirectional conduction unit D1 is one, the detection device including the detection module 100 is applicable to a single-phase alternating current charging pile including a live wire relay only. In a case that the number of the first unidirectional conduction unit D1 is three, the detection device including the detection module 100 is applicable to a three-phase alternating current charging pile including three live wire relays only.

It should be noted that the first terminal of the first unidirectional conduction unit D1 and the first terminal of the second unidirectional conduction unit D2 in the embodiment each are an anode or a cathode. That is, the anode of the first unidirectional conduction unit D1 serves as the first signal input terminal Vin1 of the detection module 100, and the cathode of the second unidirectional conduction unit D2 serves as the second signal input terminal Vin2 of the detection module 100. Alternatively, the cathode of the first unidirectional conduction unit D1 serves as the first signal input terminal Vin1 of the detection module 100, and the anode of the second unidirectional conduction unit D2 serves as the second signal input terminal Vin2 of the detection module 100. Therefore, in a case that the to-be-detected relay is stuck, a rectifying path is formed in the detection module 100, to outputs the control signal for validation to the isolation output module 200.

For example, the number of the first unidirectional conduction unit D1 is one and the anode of the first unidirectional conduction unit D1 serves as the first signal input terminal Vin1, the cathode of the second unidirectional conduction unit D2 serves as the second signal input terminal Vin2. In this way, in a case that the to-be-detected relay is stuck, a positive half cycle of an alternating current charging signal passes through a current path formed by the to-be-detected relay, the first unidirectional conduction unit D1, the control end of the isolation output module 200 and the second unidirectional conduction unit D2, so that the control signal for validation is outputted to the control end of the isolation output module 200. The isolation output module 200 outputs a detection signal with a duty cycle based on the control signal for validation. In a case that the to-be-detected relay is not stuck, the current path is cut off, and the alternating current charging signal fails to be transmitted through the detection module 100. In this case, the isolation output module 200 outputs the detection signal with another duty cycle. The fault identification device at a later stage can automatically detect based on the detection signal with the varying duty cycle whether the to-be-detected relay is stuck.

In addition, in a case that the number of the first unidirectional conduction unit D1 is one and the cathode of the first unidirectional conduction unit D1 serves as the first signal input terminal Vin1, the anode of the second unidirectional conduction unit D2 serves as the second signal input terminal Vin2. In a case that the to-be-detected relay is stuck, a negative half cycle of an alternating current charging signal passes through a current path formed by the second unidirectional conduction unit D2, the control end of the isolation output module 200, the first unidirectional conduction unit D1 and the to-be-detected relay, so that the control signal for validation is outputted to the control end of the isolation output module 200. The isolation output module 200 outputs a detection signal with a duty cycle based on the control signal for validation. In a case that the to-be-detected relay is not stuck, the current path is cut off, and the alternating current charging signal fails to be transmitted through the detection module 100, so that the detection module 100 outputs the control signal for invalidation, to control the isolation output module 200 to output the detection signal with another duty cycle. The fault identification device at a later stage can automatically detect based on the detection signals with the varying duty cycle whether the to-be-detected relay is stuck.

The detection device for a relay according to the embodiment includes the unidirectional conduction unit, a first terminal of the first unidirectional conduction unit D1 serves as the first signal input terminal Vin1 and a second terminal of the second unidirectional conduction unit D2 serves as the second signal input terminal Vin2. Therefore, the detection module 100 can output the control signal corresponding to the on-off state of the to-be-detected relay based on the two unidirectional conduction units, to control the isolation output module 200 to output the detection signal with a varying duty cycle based on a fact that the to-be-detected relay is or is not stuck, so that the fault identification device can detect whether the to-be-detected relay is stuck.

Figure 4:
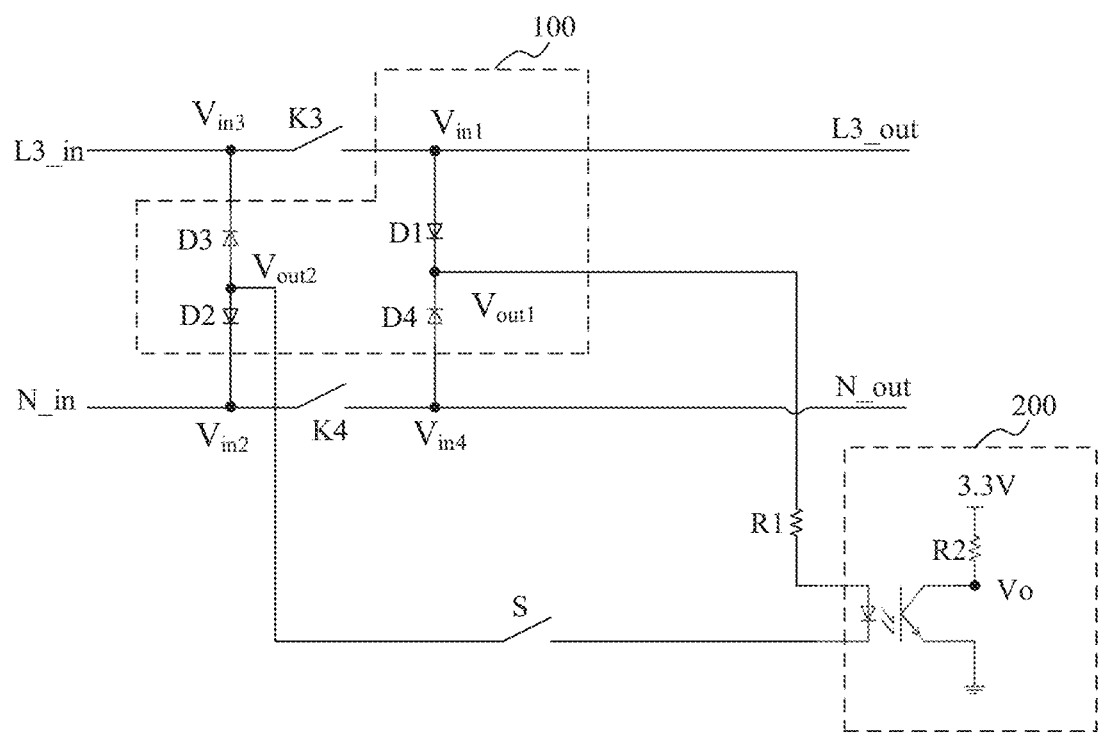
FIG. 4 is a structural block diagram showing a detection device for a relay according to another embodiment of the present disclosure.

In an embodiment, FIG. 4 is a structural block diagram of a detection device for a relay according to another embodiment of the present disclosure. Based on the above embodiment, as shown in FIG. 4, the number of the first unidirectional conduction unit D1 is one, and the detection module 100 further includes a third unidirectional conduction unit D3 and a fourth unidirectional conduction unit D4.

An anode of the third unidirectional conduction unit D3 is connected to the anode of the second unidirectional conduction unit D2, and the common anode of the third unidirectional conduction unit D3 and the second unidirectional conduction unit D2 serves as a signal output terminal Vout2 of the detection module 100. A cathode of the fourth unidirectional conduction unit D4 is connected to the cathode of the first unidirectional conduction unit D1, and the common cathode of the fourth unidirectional conduction unit D4 and the first unidirectional conduction unit D1 serves as another signal output terminal Vout1 of the detection module 100. A cathode of the third unidirectional conduction unit D3 serves as a third signal input terminal Vin3 of the detection module 100. An anode of the fourth unidirectional conduction unit D4 serves as a fourth signal input terminal Vin4 of the detection module 100.

The second signal input terminal Vin2 and the third signal input terminal Vin3 each serve as a signal input terminal of the detection module 100 connected to an input side of the to-be-detected relay. The first signal input terminal Vin1 and the fourth signal input terminal Vin4 each serve as a signal input terminal of the detection module 100 connected to the output side of the to-be-detected relay.

The to-be-detected relay in the embodiment includes a live wire relay and a neutral wire relay, or include only a live wire relay. That is, the detection device according to the embodiment can not only perform adhesion detection on a relay in a single-phase alternating current charging pile including both a live wire relay and a neutral wire relay, but also perform adhesion detection on a relay in a single-phase alternating current charging pile including a live wire relay only.

The number of the first unidirectional conduction unit D1 is one, the cathode of the first unidirectional conduction unit D1 is connected to the cathode of the fourth unidirectional conduction unit D4, and the first unidirectional conduction unit D1 and the second unidirectional conduction unit D2 form a first current path. The anode of the third unidirectional conduction unit D3 is connected to the anode of the second unidirectional conduction unit D2, and the third unidirectional conduction unit D3 and the fourth unidirectional conduction unit D4 form a second current path. The first signal input terminal Vin1 and the fourth signal input terminal Vin4 each serve as a signal input terminal connected to the output side of the relay, and the second signal input terminal Vin2 and the third signal input terminal Vin3 each serve as a signal input terminal connected to the input side of the relay. In this way, in a case that the to-be-detected relay is in a single-phase alternating current charging pile including both a live wire relay and a neutral wire relay, the first signal input terminal Vin1 and the third signal input terminal Vin3 of the detection module 100 are respectively connected to two sides of the live wire relay, and the second signal input terminal Vin2 and the fourth signal input terminal Vin4 are respectively connected to two sides of the neutral wire relay. Therefore, the detection module 100 performs adhesion detection on the live wire relay is stuck by detecting whether the first current path outputs a rectified signal (that is, the control signal for validation), and performs adhesion detection on the neutral wire relay by detecting whether the second current path outputs a rectified signal (that is, the control signal for validation). Whether the first current path outputs a rectified signal depends on whether the live wire relay is stuck, and whether the second current path outputs a rectified signal depends on whether the neutral wire relay is stuck.

For example, in a case that the live wire relay is stuck, the positive cycle of the alternating current charging signal passes through the first current path including the live wire relay, such that a first control signal is outputted. In a case that the neutral wire relay is stuck, the alternating current charging signal passes through the second current path, such that a second control signal is outputted. It can be seen that in case that a relay is stuck, the detection module 100 can output a control signal corresponding to an on-off state of the relay to the isolation output module 200, to control the isolation output module 200 to output a detection signal with a duty cycle corresponding to the on-off state of the relay, so that the fault identification device at a later stage can automatically detect whether there is a relay being stuck.

Based on this, the detection signal outputted by the detection device further informs the fault identification device to detect based on the duty cycle of the detection signal whether both the live wire relay and the neutral wire relay each are stuck or one of the live wire relay and the neutral wire relay is stuck.

In a case that one of the live wire relay and the neutral wire relay is stuck in an on state, the negative or positive half cycle of the alternating current charging signal passes through the relay that is stuck such that a first control signal is outputted to the control end of the isolation output module 200. The first control signal indicates validation and invalidation with a ratio of 1:1. The first control signal is applied to the isolation output module 200, so that the isolation output module 200 outputs a detection signal with a first duty cycle. In a case that the live wire relay and the neutral wire relay each are stuck in an on state, the positive half cycle and the negative half cycle of the alternating current charging signals respectively passes through the two relays, such that a second control signal is outputted to the control end of the isolation output module 200. A proportion of validation in the second control signal is larger than that in the first control signal, so that a duty cycle of the detection signal outputted by the isolation output module 200 is smaller. Therefore, the fault identification device can detect based on the duty cycle of the detection signal whether one relay is stuck or two relays each are stuck.

Figure 5:
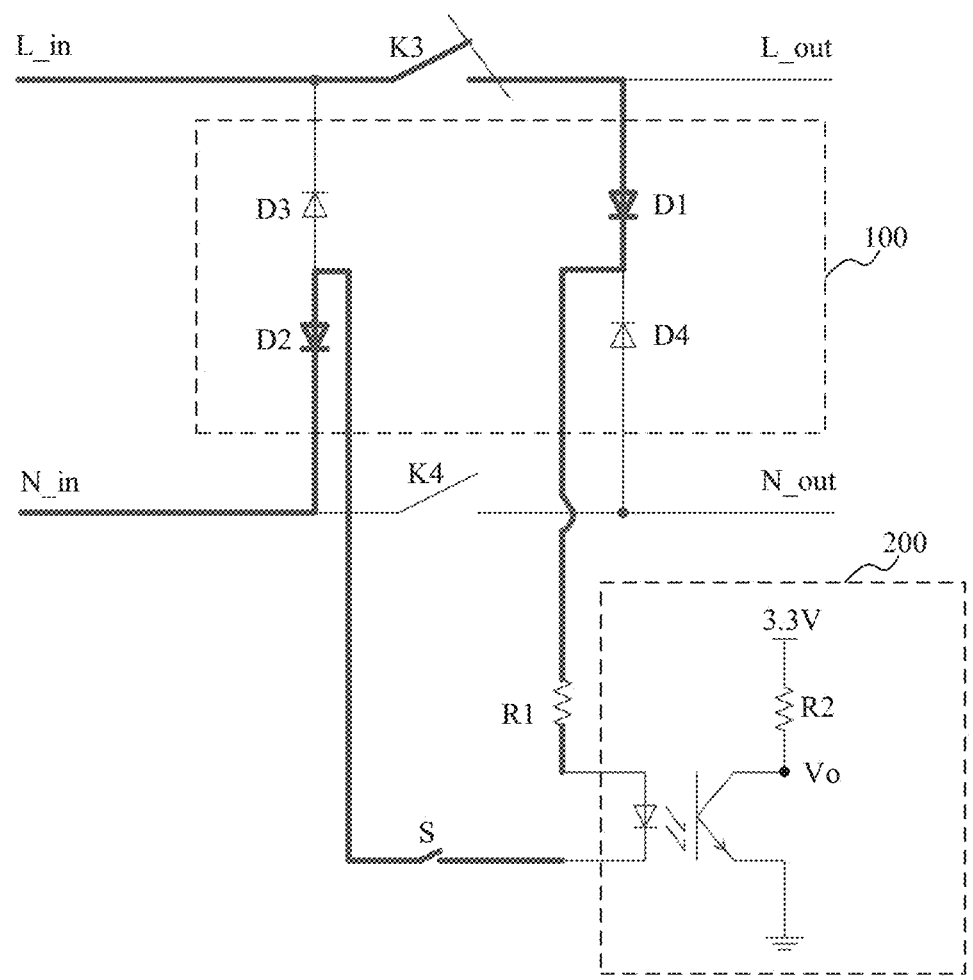
FIG. 5 is a diagram showing a path through which a current passing in a case that a relay is stuck according to an embodiment of the present disclosure.
Figure 6:
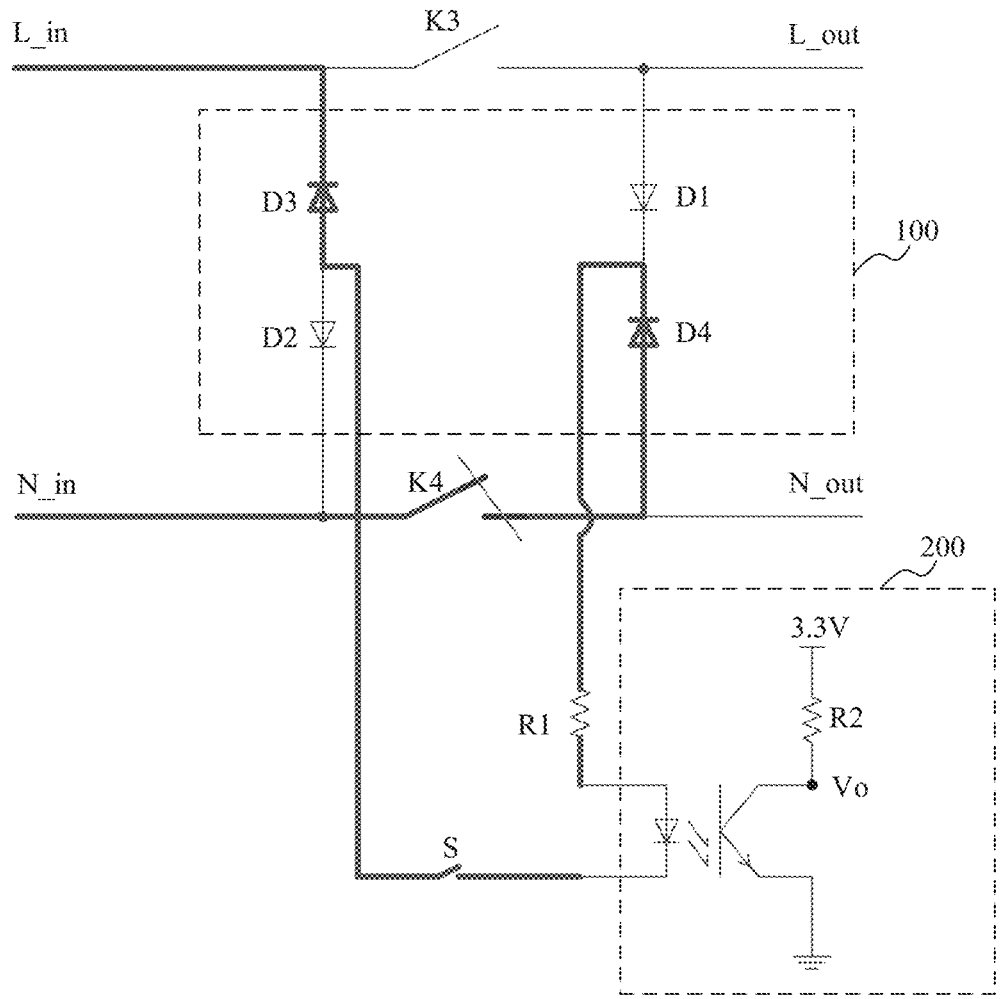
FIG. 6 is a diagram showing a path through which a current passing in a case that a relay is stuck according to another embodiment of the present disclosure.
Figure 7:
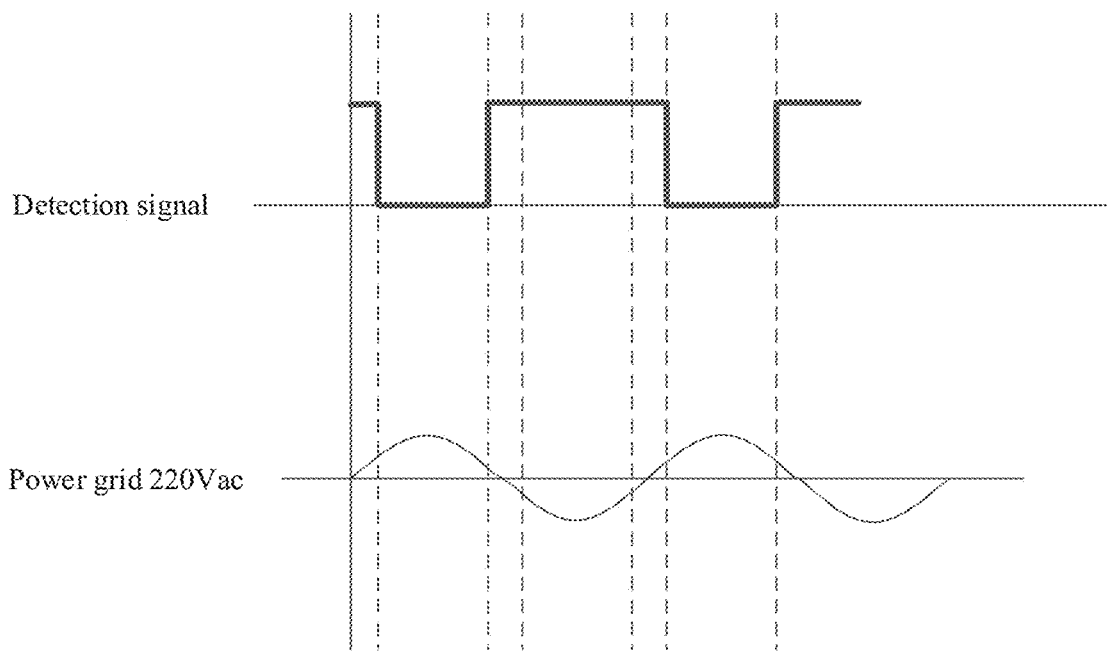
FIG. 7 is a diagram showing a detection signal in a case that a relay in a single-phase charging pile is stuck according to an embodiment of the present disclosure.

For example, FIG. 5 is a diagram showing a current path in a case that a relay is stuck according to an embodiment of the present disclosure. In this case, the live wire relay K3 is stuck. The positive half cycle of the alternating current charging signal passes through a rectifying path formed by the first unidirectional conduction unit D1 and the second unidirectional conduction unit D2. No rectifying path is formed for the negative half cycle of the alternating current charging signal. FIG. 6 is a diagram showing a current path in a case that a relay is stuck according to another embodiment of the present disclosure. In this case, the neutral wire relay K4 is stuck, the negative half cycle of the alternating current charging signal passes through a rectifying path formed by the third unidirectional conduction unit D3 and the fourth unidirectional conduction unit D4. No rectifying path is formed for the positive half cycle of the alternating current charging signal. It can be seen that in any one of the above two cases, only a half of the alternating current charging signal is applied to the isolation output module 200 through the detection module 100. The isolation output module 200 outputs a detection signal with a duty cycle approximating 50%. In a case that one of the live wire relay K3 and the neutral wire relay K4 is stuck, the detection signal outputted by the isolation detection module 100 is shown in FIG. 7. The fault identification device can detect based on the detection signal with the duty cycle of 50% that one of the live wire relay K3 and the neutral wire relay K4 is stuck.

Figure 8:
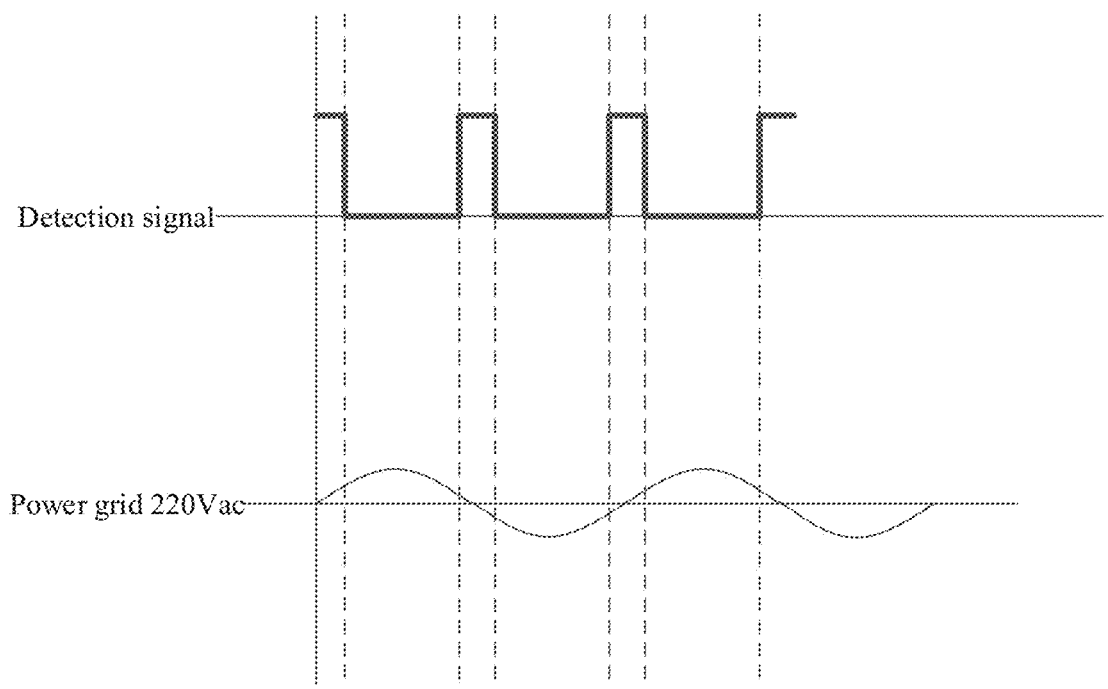
FIG. 8 is a diagram showing a detection signal in a case that two relays in a single-phase charging pile each are stuck according to an embodiment of the present disclosure.

In a case that the live wire relay K3 and the neutral wire relay K4 each are stuck, a current path is formed with a combination of the current paths in the above two cases. That is, both the positive half cycle and the negative half cycle of the alternating current charging signal cause the detection module 100 to output the control signal for validation. For example, the isolation output module 200 outputs the detection signal at a low level in a case that the detection module 100 outputs the control signal for validation, and the isolation output module 200 outputs the detection signal at a high level in a case that the detection module 100 outputs the control signal for invalidation. FIG. 8 shows a detection signal in a case that the live wire relay K3 and the neutral wire relay K4 each are stuck. In this case, the isolation output module 200 outputs the detection signal with a duty cycle approximately ranging from 0 to 10% (where a signal input terminal of the detection module 100 is turned on only when a voltage passing through the signal input terminal of the detection module 100 is greater than a voltage drop of a switch transistor in the detection module, and therefore the duty cycle of the detection signal actually approximates zero). The fault identification device detects based on the duty cycle that the live wire relay K3 and the neutral wire relay K4 each are stuck. It can be seen that based on this, when none of the live wire relay K3 and the neutral wire relay K4 is stuck, the isolation output module 200 outputs the detection signal with a duty cycle approximating 100%.

Figure 9:
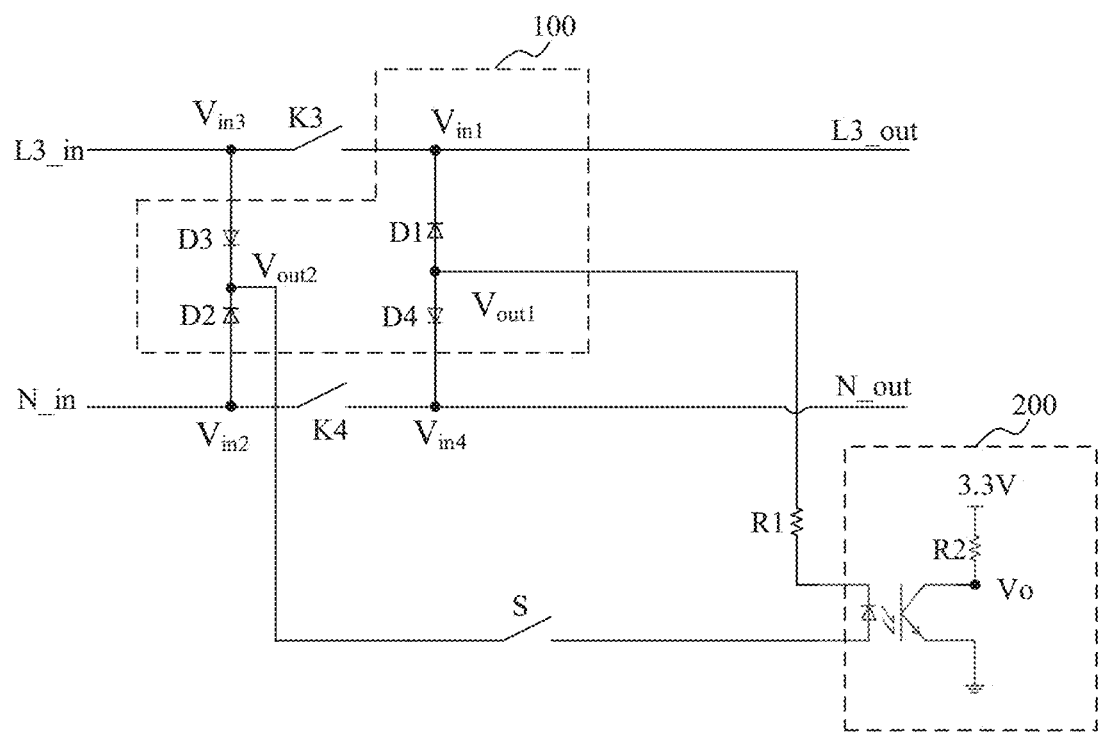
FIG. 9 is a structural block diagram showing a detection device for a relay according to another embodiment of the present disclosure.

FIG. 9 is a structural block diagram of a detection device for a relay according to another embodiment of the present disclosure. Based on the above embodiment, as shown in FIG. 9, the number of the first unidirectional conduction unit D1 is one, and the detection module 100 further includes a third unidirectional conduction unit D3 and a fourth unidirectional conduction unit D4.

A cathode of the third unidirectional conduction unit D3 is connected to a cathode of the second unidirectional conduction unit D2, and the common cathode of the third unidirectional conduction unit D3 and the cathode of the second unidirectional conduction unit D2 serves as a signal output terminal Vout2 of the detection module 100. An anode of the fourth unidirectional conduction unit D4 is connected to an anode of the first unidirectional conduction unit D1, and the common anode of the fourth unidirectional conduction unit D4 and the first unidirectional conduction unit D1 serves as another signal output terminal Vout1 of the detection module 100. An anode of the third unidirectional conduction unit D3 serves as a third signal input terminal Vin3 of the detection module 100. A cathode of the fourth unidirectional conduction unit D4 serves as a fourth signal input terminal Vin4 of the detection module 100.

The second signal input terminal Vin2 and the third signal input terminal Vin3 each serve as a signal input terminal of the detection module 100 connected to the input side of the to-be-detected relay, the first signal input terminal Vin1 and the fourth signal input terminal Vin4 each serve as a signal input terminal of the detection module 100 connected to the output side of the to-be-detected relay.

In this embodiment, the first unidirectional conduction unit D1, the second unidirectional conduction unit D2, the third unidirectional conduction unit D3 and the fourth unidirectional conduction unit D4 in the above embodiment are reversely arranged, so that the detection module 100 has another circuit structure.

In this circuit structure, if the live wire relay is stuck, the negative half cycle of the alternating current charging signal passes through a current path formed by the second unidirectional conduction unit D2 and the first unidirectional conduction unit D1, such that the control signal for validation is outputted. If the neutral wire relay is stuck, the positive half cycle of the alternating current charging signal through a current path formed by the third unidirectional conduction unit D3 and the fourth unidirectional conduction unit D4, such that the control signal for validation is outputted.

It should be noted that in order to obtain the detection module 100 in the embodiment, all the unidirectional conduction units in the above embodiment are reversely arranged and the control end of the isolation output module 200 is also reversely arranged, so that the control signal from the output terminal of the detection module 100 is applied to the isolation output module 200. For how to detect based on the duty cycle of the detection signal whether the to-be-detected relay is stuck, reference is made to the description of the above embodiment, which is not described in detail in the embodiment.

Figure 10:
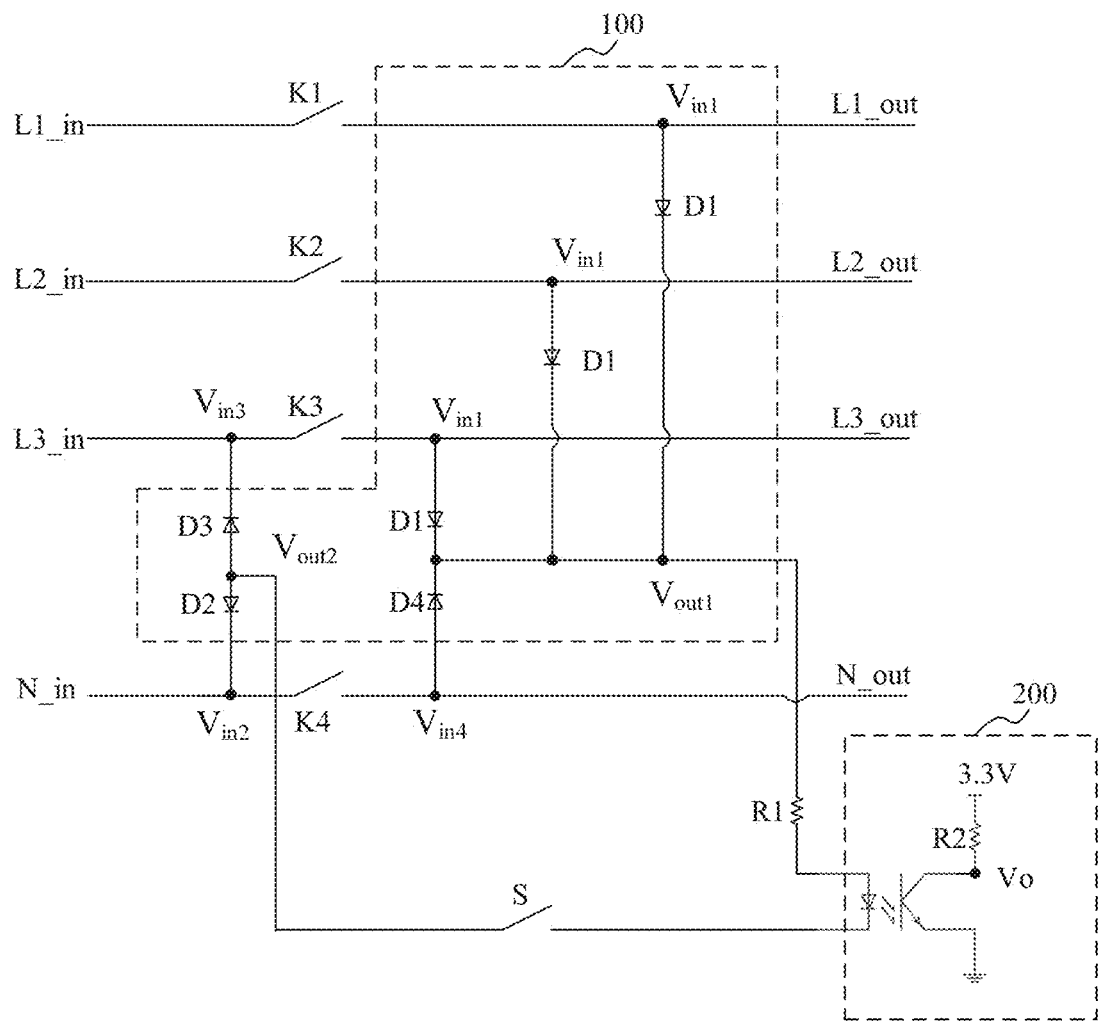
FIG. 10 is a structural block diagram showing a detection device for a relay according to another embodiment of the present disclosure.

FIG. 10 is a structural block diagram showing a detection device for a relay according to another embodiment of the present disclosure. Based on the above embodiment, as shown in FIG. 10, the number of the first unidirectional conduction unit D1 is three, and the detection module 100 further includes a third unidirectional conduction unit D3 and a fourth unidirectional conduction unit D4.

An anode of the third unidirectional conduction unit D3 is connected to an anode of the second unidirectional conduction unit D2, and the common anode of the third unidirectional conduction unit D3 and the second unidirectional conduction unit D2 serves as a signal output terminal Vout2 of the detection module 100. A cathode of the fourth unidirectional conduction unit D4 is connected to a cathode of the first unidirectional conduction unit D1, and the common cathode of the fourth unidirectional conduction unit D4 and the first unidirectional conduction unit D1 serves as another signal output terminal Vout1 of the detection module 100. A cathode of the third unidirectional conduction unit D3 serves as a third signal input terminal Vin3 of the detection module 100. An anode of the fourth unidirectional conduction unit D4 serves as a fourth signal input terminal Vin4 of the to detection module 100.

The second signal input terminal Vin2 and the third signal input terminal Vin3 each serve as a signal input terminal of the detection module 100 connected to the input side of the to-be-detected relay. The first signal input terminal Vin1 and the fourth signal input terminal Vin4 each serve as a signal input terminal of the detection module 100 connected to the output side of the to-be-detected relay.

The to-be-detected relay in the embodiment includes three live wire relays. That is, the detection device according to the embodiment is configured to perform adhesion detection on a relay in a three-phase four-wire alternating current charging pile including a neutral wire relay, and is also configured to perform adhesion detection on a relay in a three-phase four-wire alternating current charging pile including no neutral wire relay.

For example, in a case that the neutral wire relay K4 is stuck, the negative half cycle of the alternating current charging signal passes through a current path formed by the third unidirectional conduction unit D3 and the fourth unidirectional conduction unit D4, such that the control signal for validation is outputted to the control end of the isolation output module 200. In a case that a live wire relay among the three live wire relays is stuck, a positive half cycle of an alternating current charging signal of a live wire including the live wire relay that is stuck passes through a current path formed by a first unidirectional conduction unit D1 connected to the live wire relay that is stuck and the second unidirectional conduction unit D2, such that the control signal for validation is outputted to the control end of the isolation output module 200. It can be seen that in the detection device according to the embodiment, the second unidirectional conduction unit D2 and the third unidirectional conduction unit D3 are arranged at the input side, and the three first unidirectional conduction units D1 and the fourth unidirectional conduction unit D4 are arranged at the output side, to perform adhesion detection on both the neutral wire relay K4 and the live wire relay.

Alternatively, the detection device includes three third unidirectional conduction units configured to connect to input sides of the three live wire relays in one-to-one correspondence. In this embodiment, the current path in a case that the neutral wire relay K4 is stuck is formed based on one third unidirectional conduction unit D3 only, so that the detection device can perform adhesion on either a live wire relay or a neutral wire relay, and has a simple circuit structure.

By arranging three first unidirectional conduction units D1, an output side of each of the live wire relays is connected to one first unidirectional conduction unit D1, to form a current path for a current flowing through the live wire including the live wire relay in a case that the live wire relay is stuck, so as to perform the adhesion detection on the live wire relay.

In addition, each of the three first unidirectional conduction units D1 is connected to the fourth unidirectional conduction unit D4, and the three first unidirectional conduction units D1 share one fourth unidirectional conduction unit D4 to form three output side bridge arms, which can also reduce the number of devices, thereby simplifying the circuit structure. Alternatively, the number of the fourth unidirectional conduction unit D4 is three, that is, the three first unidirectional conduction units D1 are connected to the three fourth unidirectional conduction units D4 in one-to-one correspondence, to form three output side bridge arms. In the embodiment, the three first unidirectional conduction units D1 share one fourth unidirectional conduction unit D4 to form three output side bridge arms, so that the detection device is capable of adhesion detection based on a simple circuit structure.

Alternatively, each of the unidirectional conduction units in the detection module 100 are reversely arranged to form a detection module 100 with another circuit structure, which is described below in combination with the drawings.

Figure 11:
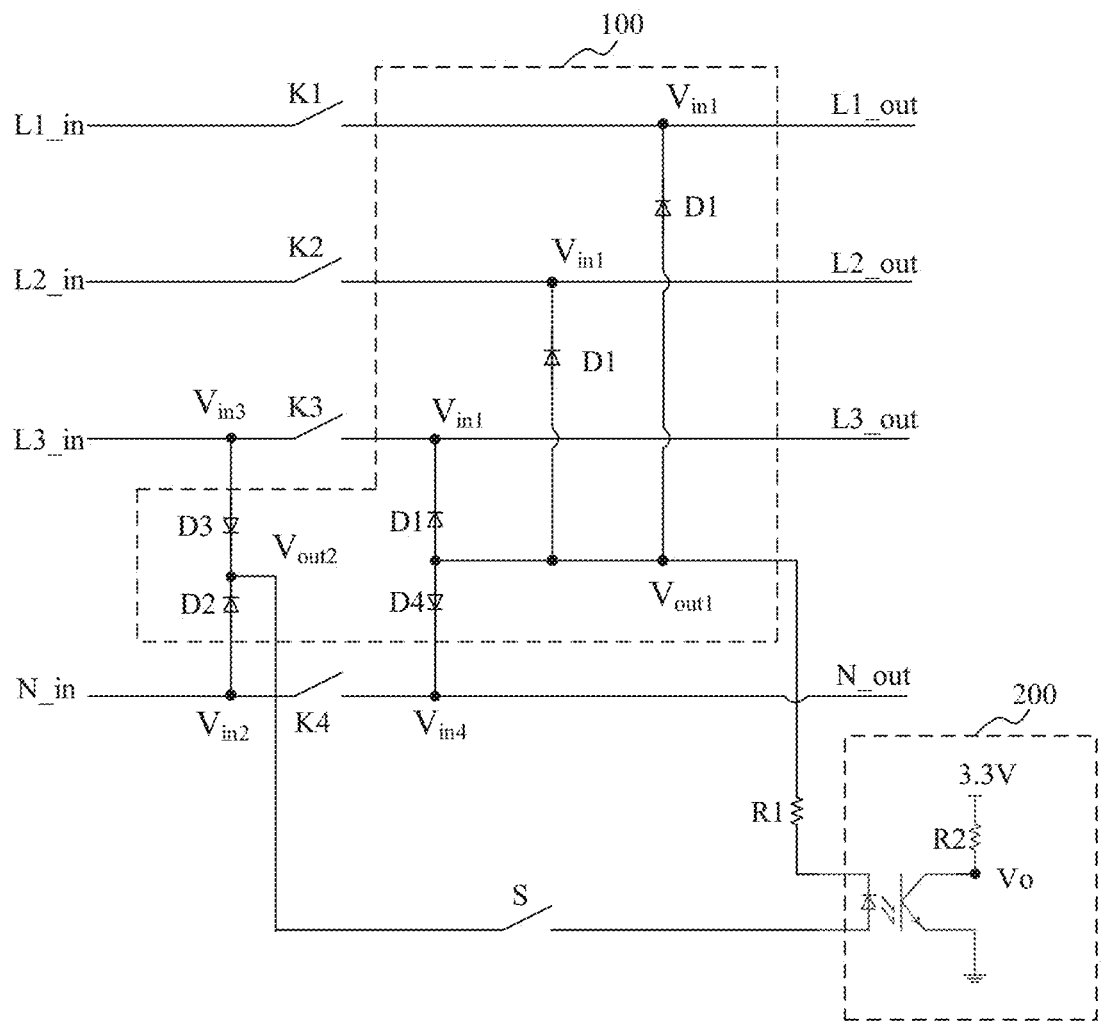
FIG. 11 is a structural block diagram showing a detection device for a relay according to another embodiment of the present disclosure.

FIG. 11 is a structural block diagram of a detection device for a relay according to another embodiment of the present disclosure. Based on the above embodiment, as shown in FIG. 11, the number of the first unidirectional conduction unit D1 is three, and the detection module 100 further includes a third unidirectional conduction unit D3 and a fourth unidirectional conduction unit D4.

A cathode of the third unidirectional conduction unit D3 is connected to a cathode of the second unidirectional conduction unit D2, and the common cathode of the third unidirectional conduction unit D3 and the second unidirectional conduction unit D2 serves as a signal output terminal Vout2 of the detection module 100. An anode of the fourth unidirectional conduction unit D4 is connected to an anode of the first unidirectional conduction unit D1, and the anode of the fourth unidirectional conduction unit D4 is connected to the anode of the first unidirectional conduction unit D1 serves as another signal output terminal Vout1 of the detection module 100. An anode of the third unidirectional conduction unit D3 serves as a third signal input terminal Vin3 of the detection module 100. A cathode of the fourth unidirectional conduction unit D4 serves as a fourth signal input terminal Vin4 of the detection module 100.

The second signal input terminal Vin2 and the third signal input terminal Vin3 each serve as a signal input terminal of the detection module 100 connected to the input side of the to-be-detected relay. The first signal input terminal Vin1 and the fourth signal input terminal Vin4 each serve as a signal input terminal of the detection module 100 connected to the output side of the to-be-detected relay.

In a case that a live wire relay is stuck, the negative half cycle of the alternating current charging signal passes through a current path formed by the second unidirectional conduction unit D2 and a first unidirectional conduction unit D1 that is connected to the live wire relay, such that the control signal for validation is outputted to the isolation output module 200.

In a case that a neutral wire relay is stuck, the positive half cycle of the alternating current charging signal passes through a current path formed by the third unidirectional conduction unit D3 and the fourth unidirectional conduction unit D4, such that the control signal for validation is outputted to the isolation output module 200. Therefore, the detection module 100 can output the control signal for validation to the isolation output module 200 in a case that a relay is stuck, to control the isolation output module 200 to output a detection signal with a duty cycle corresponding to the control signal, so that the fault identification device detects based on the duty cycle of the detection signal that there is a relay being stuck.

It can be seen that the detection module 100 in the embodiment is formed by reversely arranging all the unidirectional conduction units in the above embodiment. The detection module 100 can control the isolation output module 200 to output a detection signal with a duty cycle corresponding to a fact that at least one of a neutral wire relay and a live wire relay is stuck, so that the fault identification device at a later stage detects based on the duty cycle of the detection signal whether the to-be-detected relay is stuck.

In addition, the detection device according to the embodiment can not only detect whether a relay is stuck, but also find out a relay that is stuck. The principle of the detection is described below in combination with the drawings.

In a case that none of the four relays is stuck, the detection module 100 fails to output the control signal for validation to the isolation output module 200, and the isolation output module 200 outputs a detection signal with a duly cycle of 100%. When detecting that the duty cycle of the detection signal is 100%, the fault identification device detects that there is no relay being stuck.

Figure 12:
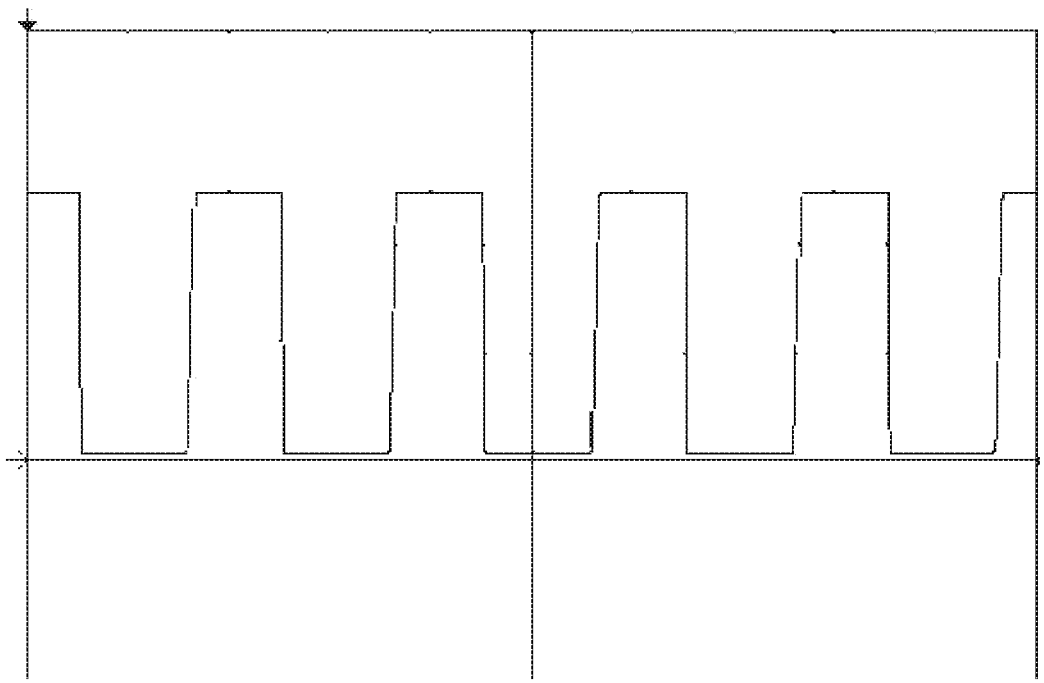
FIG. 12 is a diagram showing a simulated detection signal in a case that one relay is stuck according to an embodiment of the present disclosure.

FIG. 12 is a diagram showing a simulated detection signal in a case that one relay is stuck according to an embodiment of the present disclosure. It can be seen from FIG. 12 that, in a case that one relay is stuck, the isolation output module 200 outputs the detection signal with a duty cycle approximating 50%. When detecting that the duty cycle of the detection signal approximates 50%, the fault identification device detects that there is one relay being stuck.

Figure 13A:
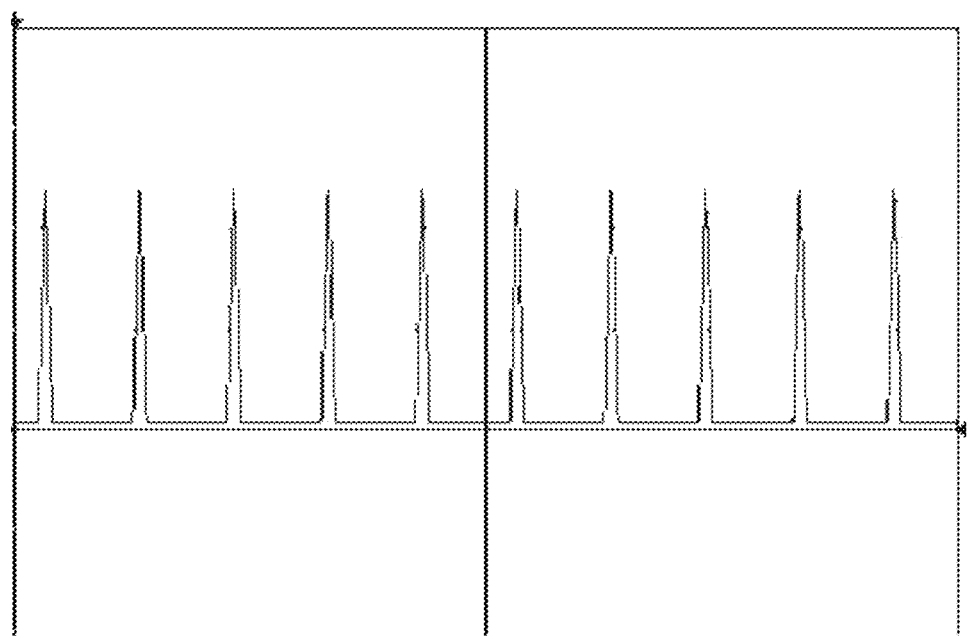
FIGS. 13a to 13c each are a diagram showing a simulated detection signal in a case that two relays each are stuck according to an embodiment of the present disclosure.
Figure 13B:
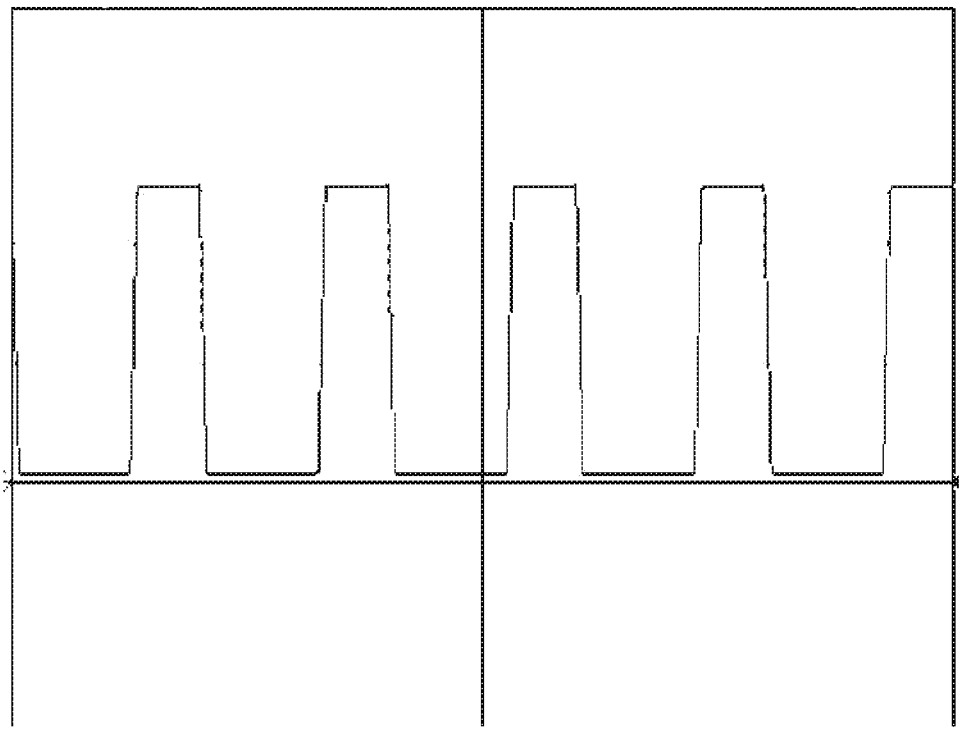
Figure 13C:
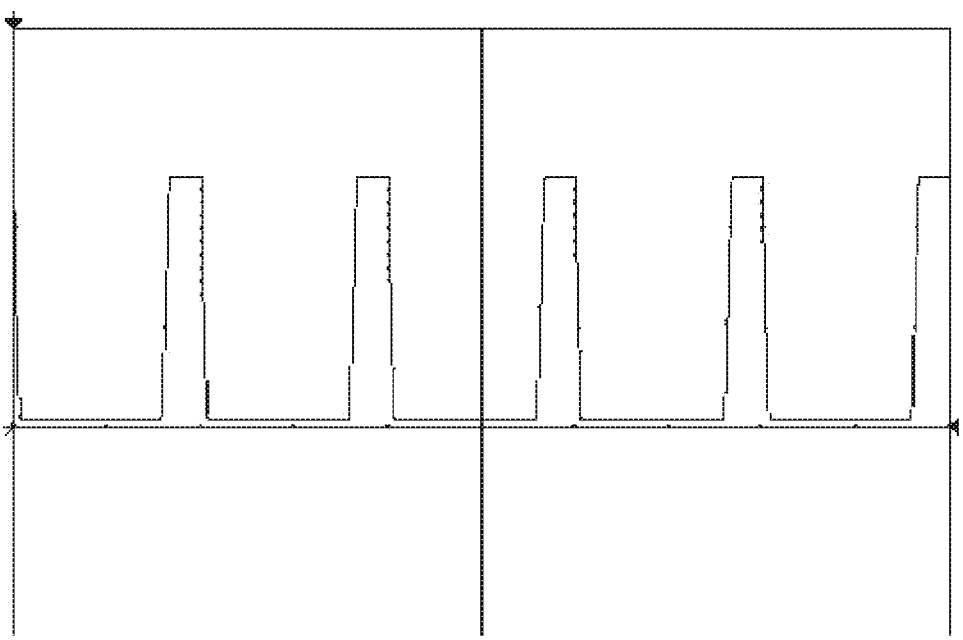

In a case that two of the four relays each are stuck, the fault identification device can find out based on the duty cycle of the detection signal the two relays that are stuck. FIGS. 13a to 13c each are a diagram showing a simulated detection signal in a case that two relays each are stuck according to an embodiment of the present disclosure. In a case that the relay K3 and the relay K4 each are stuck, the isolation output module 200 outputs the detection signal with a duty cycle of 10%, as shown in FIG. 13a. In a case that the relay K1 and the relay K4 each are stuck, or in a case that the relay K2 and the relay K4 each are stuck, the isolation output module 200 outputs the detection signal with a duty cycle of 40%, as shown in FIG. 13b. In a case that two of the relay K1, the relay K2 and the relay K3 each are stuck, the isolation output module 200 outputs the detection signal with a duty cycle of 25%, as shown in FIG. 13c.

Figure 14A:
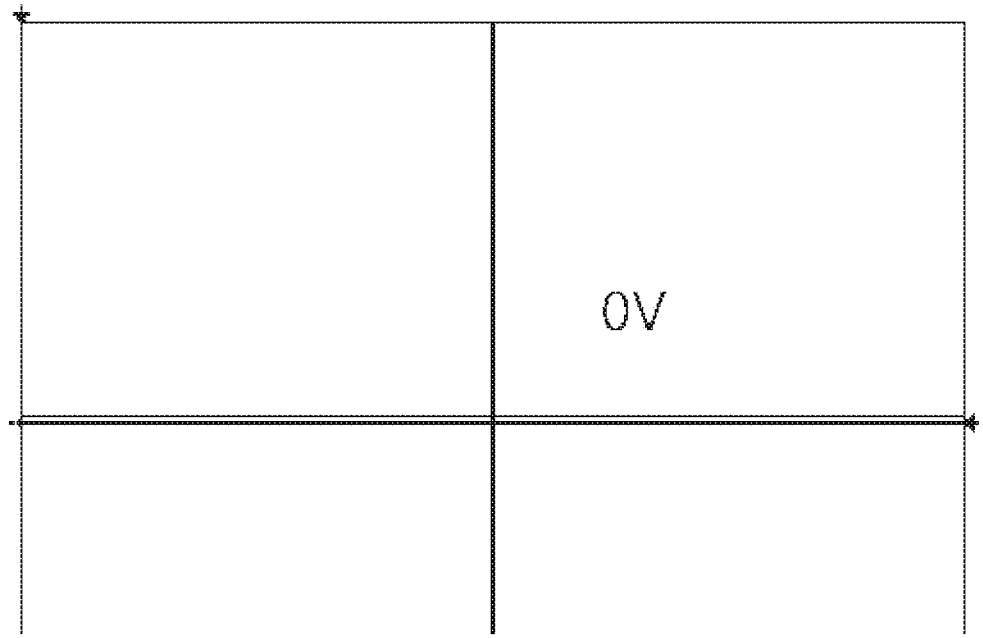
FIGS. 14a to 14b each are a diagram showing a simulated detection signal in a case that three relays each are stuck according to an embodiment of the present disclosure.
Figure 14B:
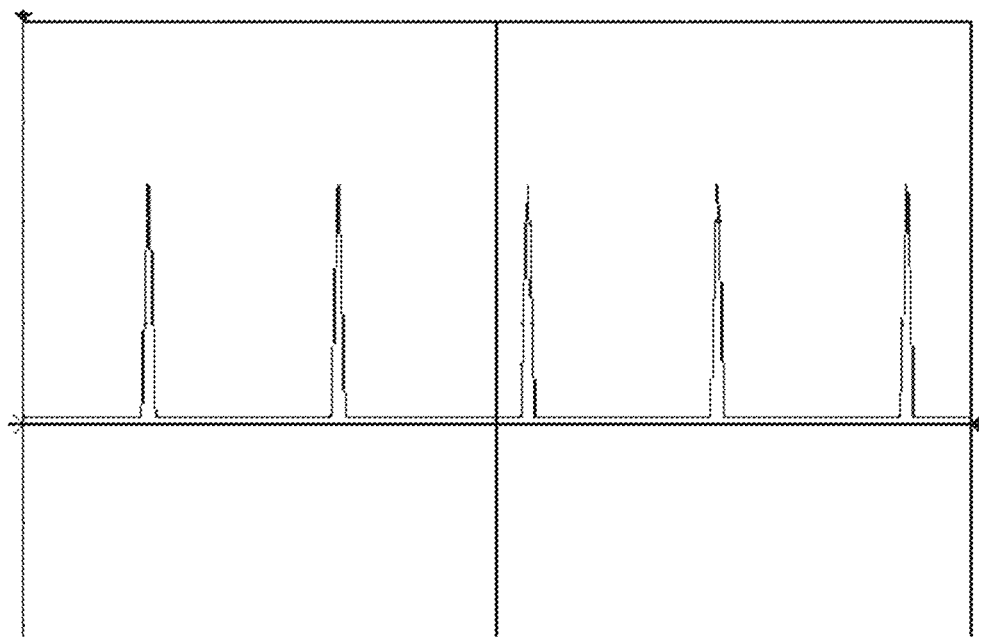

Similarly, in a case that three among the four relays each are stuck, the fault identification device detects based on the duty cycle of the detection signal whether the neutral wire relay K4 is stuck. FIGS. 14a and 14b each are a diagram showing a simulated detection signal in a case that three relays each are stuck according to an embodiment of the present disclosure. In a case that the neutral wire relay K4 is not stuck and the three live wire relays each are stuck, a duty cycle of the detection signal is zero, which is similar to the case in which the four relays each are stuck, and the detection signal in this case is as shown in FIG. 14a. In a case that the neutral wire relay K4 is stuck and two of the three live wire relays each are stuck, the isolation output module 200 outputs the detection signal with a duty cycle of 12%, and the detection signal in this case is as shown in FIG. 14a.

As described above, in a case that the four relays each are stuck, the duty cycle of the detection signal is zero, and the detection signal is as shown in FIG. 14a.

Figure 15:
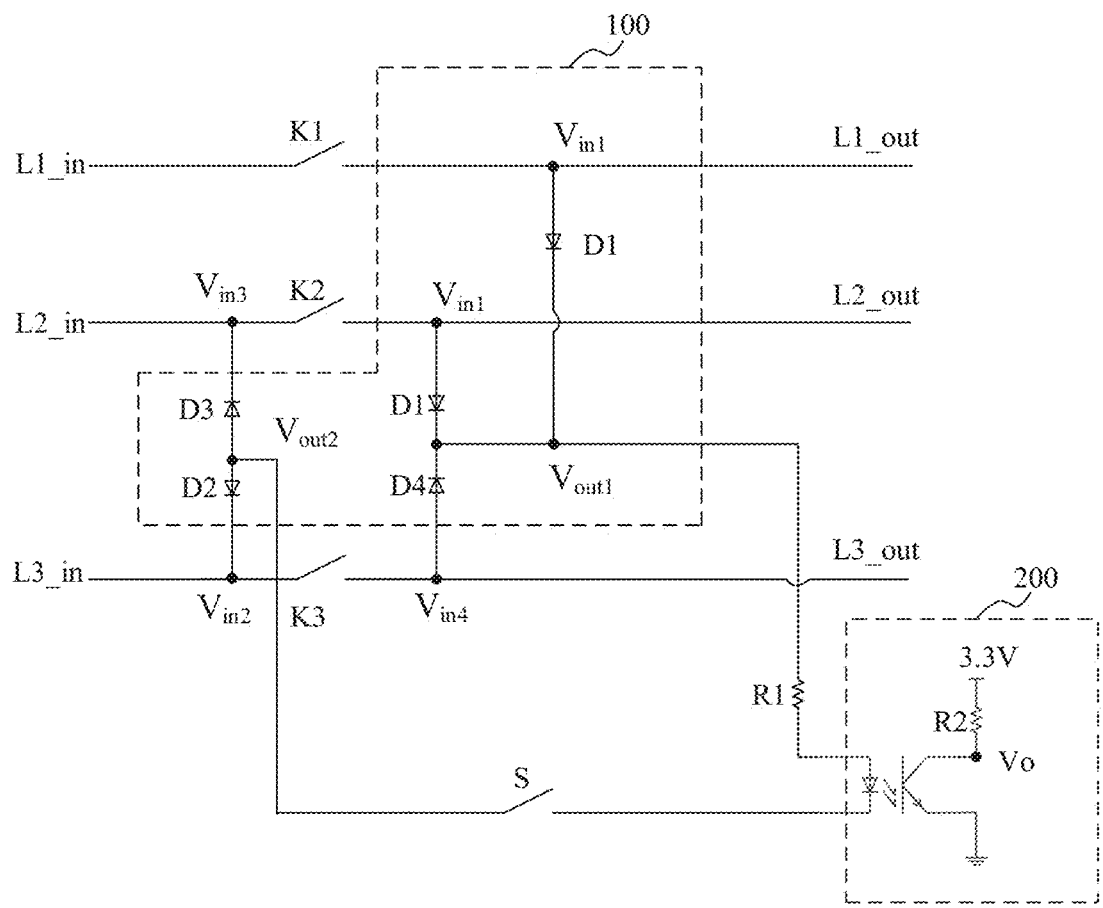
FIG. 15 is a structural block diagram showing a detection device for a relay according to another embodiment of the present disclosure.

FIG. 15 is a structural block diagram showing a detection device for a relay according to another embodiment of the present disclosure. Based on the above embodiment, as shown in FIG. 15, the detection device includes a detection module 100 and an isolation output module 200.

The detection module 100 includes two first signal input terminals Vin1, one second signal input terminal Vin2, one third signal input terminal Vin3 and one fourth signal input terminal Vin4. One of the two first signal input terminals Vin1 is configured to connect to an output side of a first to-be-detected relay, and the other of the two first signal input terminals Vin1 is configured to connect to an output side of a second to-be-detected relay. The third signal input terminal Vin3 is configured to connect to an input side of one of the first and second to-be-detected relays. The second signal input terminal Vin2 is configured to connect to an input side of a third to-be-detected relay, and the fourth signal input terminal Vin4 is configured to connect to an output side of the third to-be-detected relay.

Signal output terminals Vout1 and Vout2 of the detection module 100 each are connected to a control end of the isolation output module 200. The detection module 100 is configured to output a control signal based on an on-off state of a to-be-detected relay.

A signal output terminal Vo of the isolation output module 200 is configured to connect to a fault identification device. The isolation output module 200 is configured to output a detection signal with a duty cycle corresponding to the control signal, to inform the fault identification device to detect whether the to-be-detected relay is stuck.

The detection device according to this embodiment is appliable to a three-phase three-wire alternating current charging pile. The three-phase three-wire alternating current charging pile includes three live wires and no zero wire. Each of the three live wires is provided with a live wire relay on the live That is, the to-be-detected relay includes three live wire relays.

For example, in a case that a relay connected to the first signal input terminal Vin1 is stuck, the charging signal is applied to the detection module 100 through the first signal input terminal Vin1 and the second signal input terminal Vin2. The detection module 100 outputs a rectified signal as the control signal for validation to the control end of the isolation output module 200 through a rectifying path in the detection module 100, to control the isolation output module 200 to output the detection signal with a duty cycle. In a case that a relay connected to the fourth signal input terminal Vin4 is stuck, the charging signal is applied to the detection module 100 through the fourth signal input terminal Vin4 and the third signal input terminal Vin3. The detection module 100 outputs a rectified signal as the control signal for validation to the control end of the isolation output module 200 through another rectifying path in the detection module 100, to control the isolation output module 200 to output a detection signal with the duty cycle. In a case that none of the relays is stuck, the charging signal fails to be applied to the detection module 100. The detection module 100 outputs the control signal for invalidation, to control the isolation output module 200 to output the detection signal with another duty cycle. The fault identification device at a later stage detects based on the duty cycle of the detection signal whether there is a relay being stuck.

It can be seen that the detection device according to this embodiment is configured to perform adhesion detection on a relay in a three-phase three-wire alternating current charging pile.

In an embodiment based on the above embodiment, the detection module 100 includes two first unidirectional conduction units D1, a second unidirectional conduction unit D2, a third unidirectional conduction unit D3 and a fourth unidirectional conduction unit D4, as shown in FIG. 15.

A first terminal of each of the two first unidirectional conduction units D1 serves as a first signal input terminal Vin1. Second terminals of the two first unidirectional conduction units D1 are connected to a second terminal of the fourth unidirectional conduction unit D4, and a node at which the second terminals of the two first unidirectional conduction units D1 are connected to the second terminal of the fourth unidirectional serves as a signal output terminal Vout1 of the detection module 100.

A first terminal of the second unidirectional conduction unit D2 is connected to a first terminal of the third unidirectional conduction unit D3, and a node at which the first terminal of the second unidirectional conduction unit D2 is connected to the first terminal of the third unidirectional conduction unit D3 serves as another signal output terminal Vout2 of the detection module 100. A second terminal of the second unidirectional conduction unit D2 serves as a second signal input terminal Vin2. A second terminal of the third unidirectional conduction unit D3 serves as a third signal input terminal Vin3.

The first terminals of the four unidirectional conduction units are identical in polarity.

The first terminals of the four unidirectional conduction units each are an anode or a cathode. That is, the four unidirectional conduction units each may be reversely arranged, so that the detection module 100 has another circuit structure. For example, as shown in FIG. 15, the first terminals of the four unidirectional conduction units each are an anode.

Figure 16:
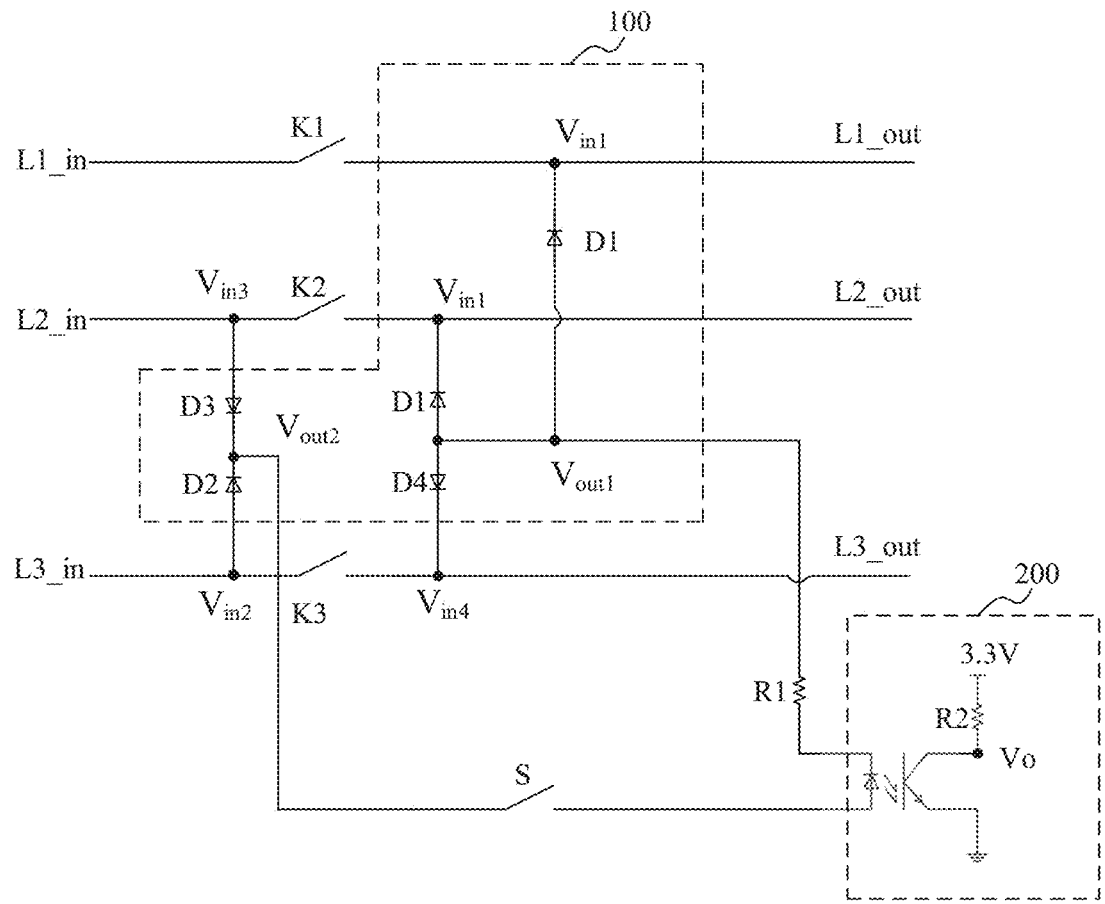
FIG. 16 is a structural block diagram showing a detection device for a relay appliable to a three-phase three-wire charging pile according to an embodiment of the present disclosure.

FIG. 16 shows the detection module 100 in a case that the first terminals of the four unidirectional conduction units each are a cathode.

Similarly, the detection device according to this embodiment is capable of finding out a relay that is stuck, which is further described below in combination with the drawings.

In a case that one of the three relays is stuck, reference is made to FIG. 12. In a case that one relay is stuck, the isolation output module 200 outputs the detection signal with a duty cycle approximating 50%. When detecting that the duty cycle of the detection signal approximates 50%, the fault identification device detects that there is one relay being stuck.

In a case that two of the three relays each are stuck, the fault identification device finds the two relays each being stuck out based on the duty cycle of the detection signal. Reference is made to FIGS. 13a to 13c. In a case that the relays K2 and K3 each are stuck, the isolation output module 200 outputs the detection signal with a duty cycle of 10%, and the detection signal in this case is as shown in FIG. 13a. In a case that the relays K1 and K3 each are stuck, the isolation output module 200 outputs the detection signal with a duty cycle of 40%, and the detection signal in this case is as shown in FIG. 13b. In a case that the relays K1 and K2 each are stuck, the isolation output module 200 outputs the detection signal with a duty cycle of 25%, and the detection signal in this case is as shown in FIG. 13c.

In a case that all the three relays each are stuck, the duty cycle of the detection signal is zero, and the detection signal is as shown in FIG. 14a.

In a case that none of the three relays is stuck, the detection module 100 fails to output the control signal for validation to the isolation output module 200, and the isolation output module 200 outputs the detection signal with a duty cycle of 100%. When detecting that the duty cycle of the detection signal is 100%, the fault identification device detects that no relay is stuck.

In an embodiment, based on the above embodiment, as shown in FIGS. 2 to 4, 8 to 11, and 15 to 16, the detection device further includes a controllable switch.

The controllable switch is connected between the signal output terminal Vout1 or Vout2 of the detection module 100 and the control end of the isolation output module 200, and a control terminal of the controllable switch is connected to the fault identification device.

The controllable switch controls, in response to the fault identification device, the detection device to start or end adhesion detection.

During a process that the alternating current charging pile performs charging, the live wire relay and the neutral wire relay K4 are on, and therefore it is unnecessary to perform adhesion detection in the process. The adhesion detection is performed only when the alternating current charging pile stops charging or starts charging. In a case of no controllable switch S, the detection device operates throughout the process that the alternating current charging pile performs charging, which lasts for a long time period, resulting in high power consumption and unnecessary waste of resources.

It should be noted that the controllable switch S in this embodiment is applicable to the single-phase alternating current charging pile, the three-phase four-wire alternating current charging pile and the three-phase three-wire alternating current charging pile described above. That is, for each of the single-phase alternating current charging pile, the three-phase four-wire alternating current charging pile and the three-phase three-wire alternating current charging pile, the controllable switch according to the embodiment is provided to control the detection device.

In the embodiment, the controllable switch S is connected between the signal output terminal of the detection module 100 and the control terminal of the isolation output module 200, to switch states of the detection device. The controllable switch S is controlled to be turned on when the charging pile is to perform charging or to stop charging, to control the detection device to perform adhesion detection on a relay. During the process that the charging pile performs charging, the detection device is off, so as to reduce power consumption of the detection device.

In an embodiment, based on the above embodiment, as shown in FIGS. 2 to 4, 8 to 11, and 15 to 16, the detection device further includes a current limiting resistor R1.

One terminal of the current limiting resistor R1 is connected to one of the signal output terminals Vout1 and Vout2 of the detection module 100, and the other terminal of the current limiting resistor R1 is connected to one terminal of the control end of the detection module 100. The current limiting resistor R1 is connected in series to an output loop of the detection module 100, to limit a current outputted from the detection module 100, so as to output a detection signal that meets requirements, thereby preventing an amplitude of the control signal from being out of a range of the isolation output module 200.

In an embodiment, based on the above embodiment, as shown in FIGS. 2 to 4, 8 to 11, and 15 to 16, the isolation output module 200 includes an optocoupler.

An anode and a cathode of a light-emitting diode of the optocoupler respectively serve as two terminals at the control end of the isolation output module 200.

A collector of a phototransistor of the optocoupler is connected to a preset voltage as a signal output terminal Vo of the isolation output module 200, and an emitter of the phototransistor of the optocoupler is grounded.

According to an operation principle of the optocoupler, when the light-emitting diode at a primary side of the optocoupler is turned on, the phototransistor at a secondary side of the optocoupler is turned on. The primary side of the optocoupler serves as the control end of the isolation output module 200. In a case that a relay is stuck, the detection module 100 outputs the control signal for validation, the light-emitting diode at the primary side of the optocoupler is turned on, and the phototransistor at the secondary side of the optocoupler operates. The optocoupler outputs a control signal at a high or low level, depending on a circuit connected to the secondary side, as the detection signal of the isolation output module 200. In addition, the control signal outputted by the detection module 100 periodically changes, and thus the detection signal outputted from the secondary side of the optocoupler periodically changes. A duty cycle of the detection signal outputted from the secondary side indicates a result of whether there is a relay being stuck. Therefore, it is detected based on the duty cycle of the detection signal outputted from the secondary side of the optocoupler whether there is a relay being stuck.

The collector of the phototransistor of the optocoupler is connected to the preset voltage, as the signal output terminal Vo of the isolation output module 200, and the emitter of the phototransistor of the optocoupler is grounded. In a case that the phototransistor does not operate, the signal output terminal Vo outputs the preset voltage, this is, a signal at a high level. In a case that the phototransistor operates, the signal output terminal Vo is grounded and thereby outputs a signal at a low level. Therefore, the fault identification device detects based on the duty cycle of the detection signal whether the to-be-detected relay is stuck.

It should be noted that a direction in which the light-emitting diode is connected depends on a direction in which the unidirectional conduction unit in the detection module 100 is arranged, so that the rectified signal outputted by the detection module 100 can be applied to the light-emitting diode.

In an embodiment, as shown in FIGS. 2 to 3, 8 to 10, and 14 to 15, the collector of the phototransistor of the optocoupler is connected to a first terminal of a pull-up resistor R2, a second terminal of the pull-up resistor R2 is connected to a pull-up voltage, and the first terminal of the pull-up resistor R2 outputs a preset voltage V0.

For example, the pull-up voltage is 3.3V. The pull-up voltage of 3.3V is divided by the pull-up resistor R2, such that the preset voltage V0 is outputted. In a case that the detection module 100 outputs the control signal for invalidation, the light-emitting diode is turned off, the phototransistor does not operate, and the optocoupler outputs the preset voltage V0, that is, outputs the detection signal at a high level. In a case that the detection module 100 outputs the control signal for validation, the light-emitting diode is turned on and the phototransistor operates, and the optocoupler outputs the detection signal at a low level.

Figure 17:
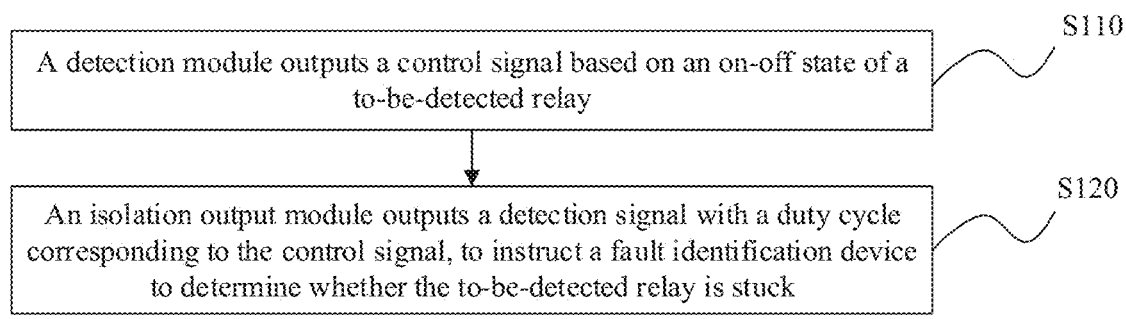
FIG. 17 is a flowchart of a method for inspecting a relay according to an embodiment of the present disclosure.

FIG. 17 is a flowchart showing a method for inspecting a relay according to an embodiment of the present disclosure. The method is applied to the detection device for a relay according to any one of the embodiments described above. As shown in FIG. 17, the method includes the following steps S110 and S120.

In step S110, the detection module outputs a control signal based on an on-off state of a to-be-detected relay.

A control signal outputted by the detection module corresponds to an on-off state of a live wire relay and of a neutral wire relay (that is, a result that whether there is a relay being stuck). In a case that a relay is stuck, the detection module outputs the control signal for validation. In a case that no relay is stuck, the detection module outputs the control signal for invalidation.

In step S120, the isolation output module outputs a detection signal with a duty cycle corresponding to the control signal, to inform the fault identification device to detect whether the to-be-detected relay is stuck.

The duty cycle of the detection signal outputted by the isolation output module varies with the control signal outputted by the detection module. The duty cycle of the detection signal corresponds to a result of whether the to-be-detected relay is stuck. Therefore, the fault identification device detects based on the duty cycle of the detection signal whether there is a relay being stuck.

In a case that the fault identification device detects that there is a relay being stuck, the alternating current charging pile is to stop charging so as to ensure safety of the charging. The charging pile is controlled to stop charging according to the conventional technology, which is not described in detail in the embodiment.

In the method for inspecting a relay in an alternating current charging pile according to the embodiment, the detection module output a rectifier signal varying with a result of whether the to-be-detected relay is stuck. The rectified signal serves as the control signal to be transmitted to the control end of the isolation output module, so that the isolation output module outputs the detection signal with a varying duty cycle. That is, the duty cycle of the detection signal corresponds to a result of whether there is a relay being stuck. Therefore, the fault identification device detects whether there is a relay being stuck based on the duty cycle of the detection signal.

Figure 18:
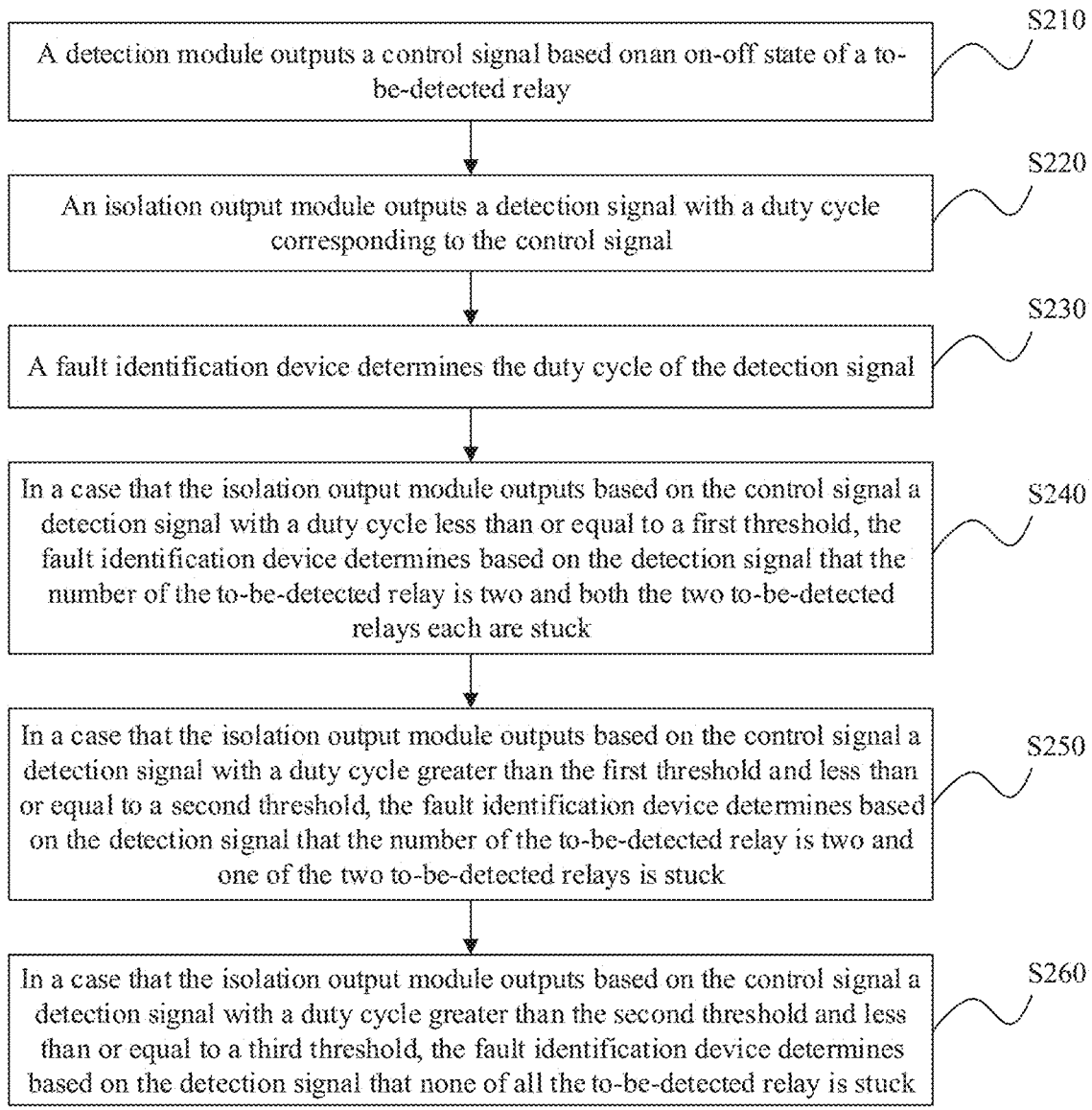
FIG. 18 is a flowchart of a method for inspecting a relay according to another embodiment of the present disclosure.

FIG. 18 is a flowchart showing a method for inspecting a relay according to another embodiment of the present disclosure. Based on the above embodiment, the method according to the embodiment is especially suitable for adhesion detection on a relay in the single-phase alternating unit charging pile. As shown in FIG. 18, the method includes the following steps S210 to S260.

In step S210, the detection module outputs a control signal based on an on-off state of a to-be-detected relay.

In step S220, the isolation output module outputs a detection signal with a duty cycle corresponding to the control signal.

In step S230, the fault identification device detects the duty cycle of the detection signal.

In step S240, in a case that the isolation output module outputs, a detection signal with a duty cycle less than or equal to a first threshold, the fault identification device detects based on the detection signal that the number of the to-be-detected relay is two and both the two to-be-detected relay are stuck.

In an embodiment, the first threshold is 10%. Due to a voltage drop of a switch transistor in the detection module, the signal input terminal of the detection module 100 is turned on only when a voltage passing through the signal input terminal of the detection module is greater than the voltage drop of the switch transistor, and therefore the duty cycle of the detection signal actually approximates zero. That is, when detecting that the duty cycle of the detection signal is less than or approximating 10%, the fault identification device detects that a present to-be-detected relay includes a live wire relay and a neutral relay and the live wire relay and the neutral relay each are stuck.

In step S250, in a case that the isolation output module outputs, based on the control signal, a detection signal with a duty cycle greater than the first threshold and less than or equal to a second threshold, the fault identification device detects based on the detection signal that the number of the to-be-detected relay is two and one of the two to-be-detected relays is stuck.

In an embodiment, the second threshold is 50%. That is, in a case that the isolation output module outputs a detection signal with a duty cycle less than or approximating 50%, the fault identification device detects that the to-be-detected relay includes a live wire relay and a neutral wire relay, and one of the live wire relay and the neutral wire relay is stuck.

In step S260, in a case that the isolation output module outputs, based on the control signal, a detection signal with a duty cycle greater than the second threshold and less than or equal to a third threshold, the fault identification device detects, based on the detection signal, that none of the to-be-detected relay is stuck.

In an embodiment, the third threshold is 100%. In this case, the isolation output module outputs a signal at a high level, indicating that the detection module outputs a control signal for invalidation, that is, no relay is stuck.

With the method for inspecting a relay according to the embodiment, in a case that it is detected based on the duty cycle of the detection signal outputted by the isolation output module that a relay is stuck, it is further detected based on the duty cycle of the detection signal whether one relay is stuck or two relays each are stuck.

Figure 19:
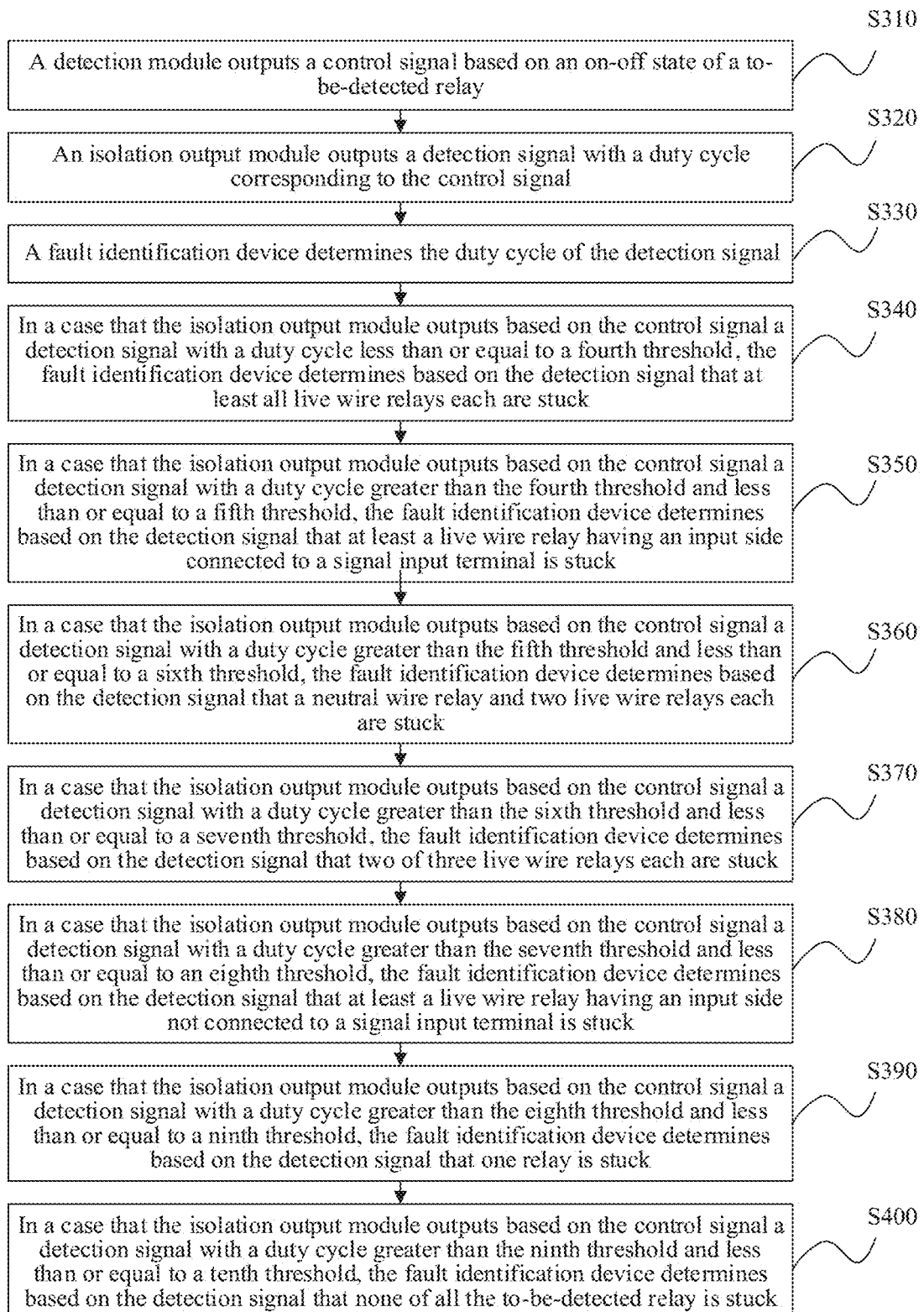
FIG. 19 is a flowchart of a method for inspecting a relay according to another embodiment of the present disclosure.

FIG. 19 is a flowchart showing a method for inspecting a relay according to another embodiment of the present disclosure. Based on the above embodiment, the method according to this embodiment is especially suitable for adhesion detection on a relay in a three-phase charging pile. That is, the method in this embodiment is applicable to both a three-phase four-wire charging pile and a three-phase three-wire charging pile. As shown in FIG. 19, the method includes the following steps S310 to S400.

In step S310, the detection module output a control signal based on an on-off state of a to-be-detected relay.

In step S320, the isolation output module outputs a detection signal with a duty cycle corresponding to the control signal.

In step S330, the fault identification device detects the duty cycle of the detection signal.

In step S340, in a case that the isolation output module outputs, based on the control signal, a detection signal with a duty cycle less than or equal to a fourth threshold, the fault identification device detects based on the detection signal that at least all live wire relays each are stuck.

In an embodiment, the fourth threshold is zero, and a waveform of the detection signal is shown in FIG. 14a in the above device embodiment.

For a three-phase four-wire alternative current charging pile in this case, the fault identification device detects that all live wire relays each are stuck and the neutral wire relay is not stuck, or the neutral wire relay and all the live wire relays each are stuck.

For a three-phase three-wire alternating current charging pile, the fault identification device detects that all live wire relays each are stuck.

In step S350, in a case that the isolation output module outputs, based on the control signal, a detection signal with a duty cycle greater than the fourth threshold and less than or equal to a fifth threshold, the fault identification device detects based on the detection signal that at least a live wire relay having an input side connected to a signal input terminal is stuck.

In an embodiment, the fifth threshold is 10%, and the detection signal in this case is as shown in FIG. 13a. For a three-phase four-wire alternating current charging pile, the fault identification device detects that the neutral line relay and a live wire relay having an input side connected to a signal input terminal each are stuck. For example, the relays K3 and K4 shown in FIG. 10 each are stuck.

For a three-phase three-wire alternating current charging pile in this case, the fault identification device detects that all live wire relay each having an input side connected to a signal input terminal is stuck. For example, the relays K2 and K3 shown in FIG. 15 each are stuck.

In step S360, in a case that the isolation output module outputs, based on the control signal, a detection signal with a duty cycle greater than the fifth threshold and less than or equal to a sixth threshold, the fault identification device detects based on the detection signal that the neutral wire relay and two of the live wire relays each are stuck.

In an embodiment, the sixth threshold is 12%, and the fault identification device detects that the neutral wire relay and two of the live wire relays each are stuck.

In step S370, in a case that the isolation output module outputs, based on the control signal, a detection signal with a duty cycle greater than the sixth threshold and less than or equal to a seventh threshold, the fault identification device detects based on the detection signal that two of the three live wire relays each are stuck.

In an embodiment, the seventh threshold is 25%. For a three-phase four-wire charging pile, the fault identification device detects that two of the three live wire relays each are stuck in this case.

For a three-phase three-wire charging pile in this case, the fault identification device detects that two relays each are stuck, and the two relays each having an output side connected to a node, at which unidirectional conduction units are connected via the same terminal, as a signal input terminal.

In step S380, in a case that the isolation output module outputs, based on the control signal, a detection signal with a duty cycle greater than the seventh threshold and less than or equal to an eighth threshold, the fault identification device detects based on the detection signal that at least a live wire relay having an input side not connected to a signal input terminal is stuck.

In an embodiment, the eighth threshold is 40%. For a three-phase four-wire charging pile, the fault identification device detects that the neutral wire relay and a live wire relay having an input side not connected to a signal input terminal each are stuck.

For a three-phase three-wire charging pile, the fault identification device detects that two relays each are stuck. An input side of one of the two relays is not connected to a signal input terminal, and an output side of the other of the two relays is connected to a node, at which unidirectional conduction units are connected with the same terminal, as a signal input terminal. For example, the relays K1 and K4 or the relays K2 and K4 shown in FIG. 10 each are stuck. Alternatively, the relays K1 and K3 shown in FIG. 15 each are stuck.

In step S390, in a case that the isolation output module outputs, based on the control signal, a detection signal with a duty cycle greater than the eighth threshold and less than or equal to a ninth threshold, the fault identification device detects based on the detection signal that one relay is stuck.

In an embodiment, the ninth threshold is 50%. In this case, for either a three-phase four-wire charging pile or a three-phase three-wire charging pile, the fault identification device detects that only one relay is stuck.

In step S400, in a case that the isolation output module outputs a detection signal with a duty cycle greater than the ninth threshold and less than or equal to a tenth threshold, the fault identification device detects based on the detection signal that none of all the to-be-detected relay is stuck.

In an embodiment, the tenth threshold is 100%. In this case, for either a three-phase four-wire charging pile or a three-phase three-wire charging pile, the fault identification device detects that no relay is stuck.

With the method for inspecting a relay according to the embodiment, it is detected whether a relay in a three-phase charging pile is stuck, and it is further found out based on a comparison result between the duty cycle of the detection signal and a preset threshold a relay that is stuck.

Figure 20:
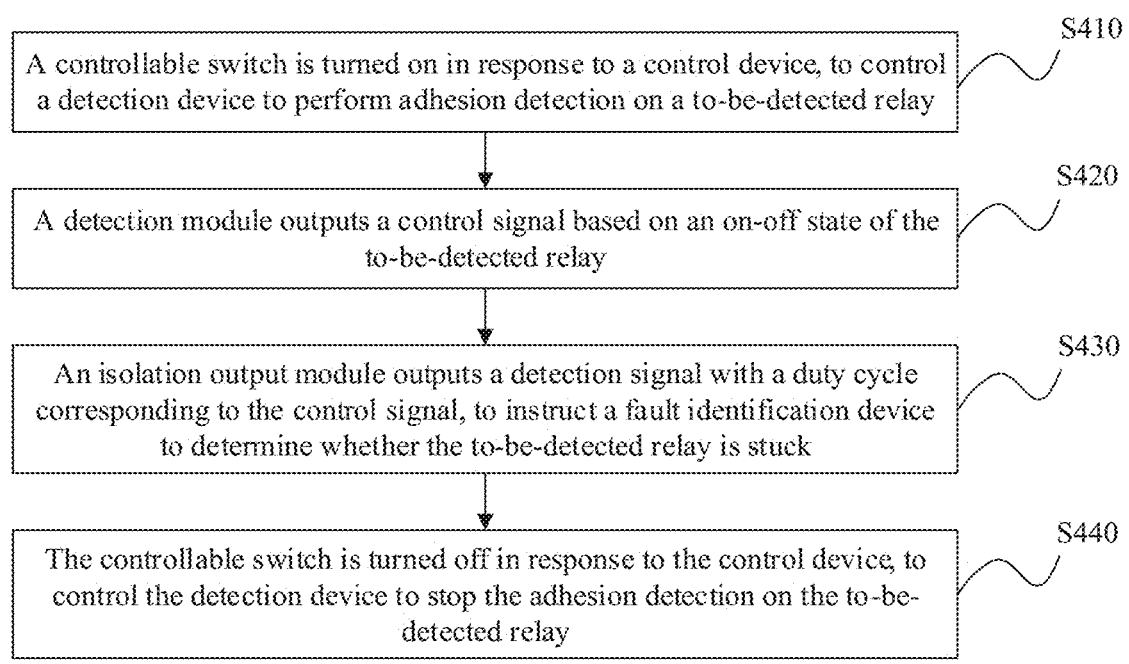
FIG. 20 is a flowchart of a method for inspecting a relay according to another embodiment of the present disclosure.

FIG. 20 is a flowchart showing a method for inspecting a relay according to another embodiment of the present disclosure. Based on the above embodiment, a controllable switch is arranged according to this embodiment, to control the detection device, for example, to start detection or stop detection before alternating current charging pile starts charging or after the alternating current charging pile stops charging. As shown in FIG. 20, the method includes the following steps S410 to S440.

In step S410, the controllable switch is turned on in response to a control device, to control the detection device perform adhesion detection on a to-be-detected relay.

The detection device includes a controllable switch. The controllable switch is connected between a signal output terminal of the detection module and the control end of the isolation output module. A control terminal of the controllable switch is in communication connection with the control device. The control device is a fault identification device, for example, a main control unit of the alternating current charging pile, or other device outside the alternating current charging pile, for example, a cloud server. In some embodiments, the controllable switch is manually controlled to be turned on or off.

When the controllable switch is turned on, the detection device starts to operate. The detection device outputs a control signal depending on a result of whether the a relay is stuck, to control the isolation output module to output a detection signal a varying duty cycle, so that the fault identification device can detect based on the duty cycle of the detection signal whether there is a relay being stuck and the number of the relay that is stuck.

In an embodiment, the controllable switch performs self-inspection in a process the charging pile performs charging. The self-inspection includes: receiving, by the controllable switch, a command for turning off the controllable switch from the control device; and detecting, by the control device, that the controllable switch is stuck in a case that the isolation output module outputs a predetermined detection signal in the process that the charging pile performs charging.

Throughout the process that the charging pile performs charging normally, the relay is on, and the detection module outputs the control signal for validation, so that the isolation output module outputs a signal at a low level. That is, the detection device outputs a detection signal of a duty cycle of zero throughout the process that the charging pile performs charging normally. In a case that the controllable switch is turned off when receiving the command for turning off the controllable switch, the isolation output module outputs a signal at a high level, that is, the detection device outputs a detection signal with a duty cycle of 100%. In this case, if the detection device outputs the detection signal with a duty cycle of zero, it is detected that the controllable switch is stuck.

In step S420, the detection module output a control signal based on an on-off state of a to-be-detected relay.

In step S430, the isolation output module outputs a detection signal with a duty cycle corresponding to the control signal, to inform the fault identification device to detect whether the to-be-detected relay is stuck.

In step S440, the controllable switch is turned off in response to the control device, to control the detection device to stop the adhesion detection on the to-be-detected relay.

In order to end the charging, the control device transmits the command for turning off the controllable switch to the controllable switch, to inform the controllable switch to be turned off, and control the detection device to stop the adhesion detection.

With the method for inspecting a relay according to the embodiment, the detection device is provided with a controllable switch, to control the detection device to start or end the adhesion detection. In addition, whether the controllable switch is stuck is detected by self-inspection in the process that the charging pile performs charging.

In an embodiment, based on the above embodiment, a charging pile is further provided according to an embodiment of the present disclosure. The charging pile includes the detection device for a relay according to any one of the above embodiments. Therefore, this embodiment has the same beneficial effects as any of the above embodiments.

It should be noted that the above description shows only the preferred embodiments and the technical principle of the present disclosure. Those skilled in the art should understand that the present disclosure is not limited to the embodiments described above. Those skilled in the art can easily think of various changes, re-adjustments and substitutions without departing from the protection scope of the present disclosure. Therefore, although the present disclosure to is described in detail through the above embodiments, the present disclosure is not limited to the above embodiments. The present disclosure intends to include other equivalent embodiments without departing from the concept of the present disclosure, and the present disclosure should fall within the scope of the claims.

The invention claimed is:

1. A detection device for a relay, comprising: a detection module and an isolation output module, wherein,
 the detection module comprises a first signal input terminal and a second signal input terminal, wherein the number of the first signal input terminals is more than one, each of the more than one the first signal input terminals is configured to connect to an output side of a to-be-detected relay, the second signal input terminal is configured to connect to a neutral wire, a signal output terminal of the detection module is configured to connect to a control end of the isolation output module, and the detection module is configured to output a control signal based on an on-off state of the to-be-detected relay; and
 a signal output terminal of the isolation output module is configured to connect to a fault identification device, and the isolation output module is configured to output a detection signal with a duty cycle corresponding to the control signal, to inform the fault identification device to detect whether the to-be-detected relay is stuck, wherein the detection device is configured to perform adhesion detection on the to-be-detected relay without an action to turn on another relay, and the duty cycle of the detection signal is in a correspondence with the on-off state of the to-be-detected relay.

2. The detection device for a relay according to claim 1, wherein
 the detection module comprises a first unidirectional conduction unit and a second unidirectional conduction unit, wherein
 the number of the first unidirectional conduction unit is at least one;
 a first terminal of the at least one first unidirectional conduction unit serves as the first signal input terminal, and a second terminal of the at least one first unidirectional conduction unit is connected together, as a signal output terminal of the detection module; and
 a first terminal of the second unidirectional conduction unit serves as another signal output terminal of the detection module, a second terminal of the second unidirectional conduction unit serves as the second signal input terminal, and the first terminal of the second unidirectional conduction unit is identical to the first terminal of the first unidirectional conduction unit in polarity.

3. The detection device for a relay according to claim 2, wherein
 the number of the first unidirectional conduction unit is one, and the detection module further comprises a third unidirectional conduction unit and a fourth unidirectional conduction unit, wherein
 an anode of the third unidirectional conduction unit is connected to an anode of the second unidirectional conduction unit, and the common anode of the third unidirectional conduction unit and the second unidirectional conduction unit serves as a signal output terminal of the detection module; a cathode of the fourth unidirectional conduction unit is connected to a cathode of the first unidirectional conduction unit, and the common cathode of the fourth unidirectional conduction unit and the first unidirectional conduction unit serves as another signal output terminal of the detection module; a cathode of the third unidirectional conduction unit serves as a third signal input terminal of the detection module; and an anode of the fourth unidirectional conduction unit serves as a fourth signal input terminal of the detection module; and
 the second signal input terminal and the third signal input terminal each serve as a signal input terminal of the detection module configured to connect to an input side of the to-be-detected relay, and the first signal input terminal and the fourth signal input terminal each serve as a signal input terminal of the detection module configured to connect to the output side of the to-be-detected relay.

4. The detection device for a relay according to claim 2, wherein
 the number of the first unidirectional conduction unit is one, and the detection module further comprises a third unidirectional conduction unit and a fourth unidirectional conduction unit, and wherein
 a cathode of the third unidirectional conduction unit is connected to a cathode of the second unidirectional conduction unit, and the common cathode of the third unidirectional conduction unit and the second unidirectional conduction unit serves as a signal output terminal of the detection module; an anode of the fourth unidirectional conduction unit is connected to an anode of the first unidirectional conduction unit, and the common anode of the fourth unidirectional conduction unit and the first unidirectional conduction unit serves as another signal output terminal of the detection module; an anode of the third unidirectional conduction unit serves as a third signal input terminal of the detection module; and a cathode of the fourth unidirectional conduction unit serves as a fourth signal input terminal of the detection module; and
 the second signal input terminal and the third signal input terminal each serve as a signal input terminal of the detection module configured to connect to an input side of the to-be-detected relay, and the first signal input terminal and the fourth signal input terminal each serve as a signal input terminal of the detection module configured to connect to the output side of the to-be-detected relay.

5. The detection device for a relay according to claim 2, wherein
 the number of the first unidirectional conduction unit is three, and the detection module further comprises a third unidirectional conduction unit and a fourth unidirectional conduction unit, and wherein
 an anode of the third unidirectional conduction unit is connected to an anode of the second unidirectional conduction unit, and the common anode of the third unidirectional conduction unit and the second unidirectional conduction unit serves as a signal output terminal of the detection module; a cathode of the fourth unidirectional conduction unit is connected to cathodes of the three first unidirectional conduction units, and the common cathode of the fourth unidirectional conduction unit and the three first unidirectional conduction unit serves as another signal output terminal of the detection module; a cathode of the third unidirectional conduction unit serves as a third signal input terminal of the detection module; and an anode of the fourth unidirectional conduction unit serves as a fourth signal input terminal of the detection module; and the second signal input terminal and the third signal input terminal each serve as a signal input terminal of the detection module configured to connect to an input side of the to-be-detected relay, and the first signal input terminal and the fourth signal input terminal each serve as a signal input terminal of the detection module configured to connect to the output side of the to-be-detected relay.

6. The detection device for a relay according to claim 2, wherein the number of the first unidirectional conduction unit is three, and the detection module further comprises a third unidirectional conduction unit and a fourth unidirectional conduction unit, and wherein a cathode of the third unidirectional conduction unit is connected to a cathode of the second unidirectional conduction unit, and the common cathode of the third unidirectional conduction unit and the second unidirectional conduction unit serves as a signal output terminal of the detection module; an anode of the fourth unidirectional conduction unit is connected to an anode of the first unidirectional conduction unit, and the common anode of the fourth unidirectional conduction unit and the first unidirectional conduction unit serves as another signal output terminal of the detection module; an anode of the third unidirectional conduction unit serves as a third signal input terminal of the detection module; and a cathode of the fourth unidirectional conduction unit serves as a fourth signal input terminal of the detection module; and the second signal input terminal and the third signal input terminal each serve as a signal input terminal of the detection module configured to connect to an input side of the to-be-detected relay, and the first signal input terminal and the fourth signal input terminal each serve as a signal input terminal of the detection module configured to connect to the output side of the to-be-detected relay.

7. The detection device for a relay according to claim 1, further comprising: a controllable switch, wherein, the controllable switch is connected between a signal output terminal of the detection module and the control end of the isolation output module, and a control terminal of the controllable switch is configured to connect to the fault identification device; and the controllable switch is configured to control, in response to the fault identification device, the detection device to start or stop adhesion detection.

8. The detection device for a relay according to claim 1, wherein, the isolation output module comprises an optocoupler, wherein, an anode and a cathode of a light-emitting diode of the optocoupler respectively serve as two terminals at the control end of the isolation output module; and a collector of a phototransistor of the optocoupler is configured to connect to a preset voltage, as the signal output terminal of the isolation output module, and an emitter of the phototransistor of the optocoupler is grounded.

9. A detection device for a relay, comprising: a detection module and an isolation output module, wherein, the detection module comprises two first signal input terminals, one second signal input terminal, one third signal input terminal and one fourth signal input terminal, the two first signal input terminals are configured to respectively connect to output sides of two to-be-detected relays, the third signal input terminal is configured to connect to an input side of one of the two to-be-detected relays, the second signal input terminal and the fourth signal input terminal are configured to respectively connect to an input side and an output side of another to-be-detected relay;

a signal output terminal of the detection module is connected to a control end of the isolation output module, and the detection module is configured to output a control signal based on an on-off state of a to-be-detected relay; and a signal output terminal of the isolation output module is configured to connect to a fault identification device, and the isolation output module is configured to output a detection signal with a duty cycle corresponding to the control signal, to inform the fault identification device to detect whether there is a to-be-detected relay being stuck, wherein the detection device is configured to perform adhesion detection on the to-be-detected relay without an action to turn on another relay, and the duty cycle of the detection signal is in a correspondence with the on-off state of the to-be-detected relay.

10. The detection device for a relay according to claim 9, wherein the detection module comprises two first unidirectional conduction units, one second unidirectional conduction unit, one third unidirectional conduction unit and one fourth unidirectional conduction unit;

first terminals of the first unidirectional conduction units serve as the two first signal input terminals respectively, second terminals of the two first unidirectional conduction units are connected to a second terminal of the fourth unidirectional conduction unit, as a signal output terminal of the detection module;

a first terminal of the second unidirectional conduction unit is connected to a first terminal of the third unidirectional conduction unit, as another signal output terminal of the detection module; and a second terminal of the second unidirectional conduction unit serves as the second signal input terminal, and a second terminal of the third unidirectional conduction unit serves as the third signal input terminal; and respective first terminals of the four unidirectional conduction units are identical in polarity.

11. The detection device for a relay according to claim 9, further comprising: a controllable switch, wherein the controllable switch is connected between a signal output terminal of the detection module and the control end of the isolation output module, and a control terminal of the controllable switch is configured to connect to the fault identification device; and the controllable switch is configured to control, in response to the fault identification device, the detection device to start or end adhesion detection.

12. A method for inspecting a relay, applied to the detection device for a relay according to claim 1, wherein the method comprises:

outputting, by a detection module, a control signal based on an on-off state of a to-be-detected relay; and outputting, by the isolation output module, a detection signal with a duty cycle corresponding to the control signal, to inform the fault identification device to detect whether the to-be-detected relay is stuck.

13. The method for inspecting a relay according to claim 12, wherein the detection device for a relay is applied to a single-phase charging pile, and the outputting, by the isolation output module, a detection signal with a duty cycle corresponding to the control signal, to inform the fault identification device to detect whether the to-be-detected relay is stuck comprises one of:
outputting, by the isolation output module based on the control signal, the detection signal with the duty cycle less than or equal to a first threshold, and detecting, by the fault identification device based on the detection signal, that the number of the to-be-detected relay is two and the two to-be-detected relays each are stuck;
outputting, by the isolation output module based on the control signal, the detection signal with the duty cycle greater than the first threshold and less than or equal to a second threshold, and detecting, by the fault identification device based on the detection signal, that the number of the to-be-detected relay is two and one of the two to-be-detected relays is stuck; and
outputting, by the isolation output module based on the control signal, the detection signal with the duty cycle greater than the second threshold and less than or equal to a third threshold, and detecting, by the fault identification device based on the detection signal, that none of all the to-be-detected relay is stuck.

14. The detection method for a relay according to claim 12, wherein the detection device for a relay is applied to a three-phase charging pile, and the outputting, by the isolation output module, a detection signal with a duty cycle corresponding to the control signal, to inform the fault identification device to detect whether the to-be-detected relay is stuck comprises one of:
outputting, by the isolation output module based on the control signal, the detection signal with the duty cycle less than or equal to a fourth threshold, and detecting, by the fault identification device based on the detection signal, that at least all live wire relays each are stuck;
outputting, by the isolation output module based on the control signal, the detection signal with the duty cycle greater than the fourth threshold and less than or equal to a fifth threshold, and detecting, by the fault identification device based on the detection signal, that at least a live wire relay having an input side connected to a signal input terminal is stuck;
outputting, by the isolation output module based on the control signal, the detection signal with the duty cycle greater than the fifth threshold and less than or equal to a sixth threshold, and detecting, by the fault identification device based on the detection signal, if the isolation output module outputs a detection signal with a duty cycle greater than a sixth threshold, that a neutral wire relay and two of the all live wire relays each are stuck;
outputting, by the isolation output module based on the control signal, the detection signal with the duty cycle greater than the sixth threshold and less than or equal to a seventh threshold, and detecting, by the fault identification device based on the detection signal, that two of three live wire relays each are stuck;
outputting, by the isolation output module based on the control signal, the detection signal with the duty cycle greater than the seventh threshold and less than or equal to an eighth threshold, and detecting, by the fault identification device based on the detection signal, that at least a live wire relay having an input side not connected to a signal input terminal is stuck;
outputting, by the isolation output module based on the control signal, the detection signal with the duty cycle greater than the eighth threshold and less than or equal to a ninth threshold, and detecting, by the fault identification device based on the detection signal, that there is one relay being stuck; and
outputting, by the isolation output module based on the control signal, the detection signal with the duty cycle greater than the ninth threshold and less than or equal to a tenth threshold, and detecting, by the fault identification device based on the detection signal, that none of the to-be-detected relay is stuck.

15. The method for inspecting a relay according to claim 12, wherein
the detection device for a relay further comprises a controllable switch, and the controllable switch is connected between a signal output terminal of the detection module and the control end of the isolation output module, and a control terminal of the controllable switch is in communication connection with a control device, and wherein the method further comprises:
controlling the controllable switch to be turned on in response to the control device, to control the detection device to perform adhesion detection on the to-be-detected relay.

16. The method for inspecting a relay according to claim 15, further comprising:
receiving, by the controllable switch, a command for turning off the controllable switch from the control device; and
detecting, by the control device in a case that the isolation output module outputs a predetermined detection signal in a charging process, that the controllable switch is stuck.

17. A charging pile, comprising: the detection device for a relay according to claim 1.

18. A charging pile, comprising: the detection device for a relay according to claim 9.

19. A method for inspecting a relay, applied to the detection device for a relay according to claim 9, wherein the method comprises:
outputting, by a detection module, a control signal based on an on-off state of a to-be-detected relay; and
outputting, by the isolation output module, a detection signal with a duty cycle corresponding to the control signal, to inform the fault identification device to detect whether the to-be-detected relay is stuck.

* * * * *